(12) United States Patent
Terada et al.

(10) Patent No.: US 9,075,119 B2
(45) Date of Patent: Jul. 7, 2015

(54) GRADIENT MAGNETIC FIELD COIL AND MAGNETIC RESONANCE IMAGING DEVICE

(75) Inventors: Masanao Terada, Tokai (JP); Mitsushi Abe, Hitachinaka (JP); Yukinobu Imamura, Hitachi (JP); Hiroyuki Takeuchi, Kashiwa (JP); Takeshi Yatsuo, Kashiwa (JP); Akira Kurome, Kashiwa (JP)

(73) Assignee: HITACHI MEDICAL CORPORATION, Tokyo (JP)

( * ) Notice: Subject to any disclaimer, the term of this patent is extended or adjusted under 35 U.S.C. 154(b) by 490 days.

(21) Appl. No.: 13/391,066

(22) PCT Filed: Aug. 26, 2010

(86) PCT No.: PCT/JP2010/064520
§ 371 (c)(1),
(2), (4) Date: Feb. 17, 2012

(87) PCT Pub. No.: WO2011/040157
PCT Pub. Date: Apr. 7, 2011

(65) Prior Publication Data
US 2012/0176137 A1    Jul. 12, 2012

(30) Foreign Application Priority Data

Sep. 30, 2009  (JP) ................................ 2009-225918
Aug. 6, 2010   (JP) ................................ 2010-177085

(51) Int. Cl.
*G01R 33/385*   (2006.01)
*G01R 33/421*   (2006.01)

(52) U.S. Cl.
CPC .......... *G01R 33/385* (2013.01); *G01R 33/4215* (2013.01)

(58) Field of Classification Search
CPC .......................... G01R 33/385; G01R 33/4215
See application file for complete search history.

(56) References Cited

U.S. PATENT DOCUMENTS 4,766,383 A * 8/1988 Fox et al. ..................... 324/318
4,820,988 A * 4/1989 Crooks et al. ................ 324/318
(Continued)

FOREIGN PATENT DOCUMENTS

CN          1875288 A      12/2006
JP     2001-112737 A       4/2001
(Continued)

OTHER PUBLICATIONS

Chinese Office Action received in Chinese Application No. 201080036855 dated Sep. 29, 2013.
Overweg et al., "A high-efficiency asymmetric Gradient Coil", Proc. Intl. Soc. Reson. Med. 11 (2003), 1 page.

*Primary Examiner* — Dixomara Vargas
(74) *Attorney, Agent, or Firm* — Mattingly & Malur, PC

(57) ABSTRACT

In the magnetic resonance imaging device, the distance between the first and second coils is different in the circumferential direction and has a first region (A1) ($\theta=0, \pi$) and a second region (A2) ($\theta=\pi/2$) narrower than the first region (A1). In the first coil, wiring patterns (17a, 17b) on the side of a zero-plane (F0) passing through the center of the first coil and perpendicular to the axis direction (z-axis direction) meander in the circumferential direction such that the wiring patterns (17a, 17b) depart from the zero-plane (F0) in the first region (A1) and approach the zero-plane (F0) in the second region (A2). This provides a gradient magnetic field coil capable of configuring wiring patterns without using a loop coil that does not pass through the z-axis.

9 Claims, 30 Drawing Sheets

(56) References Cited

U.S. PATENT DOCUMENTS

| | | | |
|---|---|---|---|
| 6,023,166 A * | 2/2000 | Eydelman | 324/318 |
| 6,448,774 B1 * | 9/2002 | Heid | 324/318 |
| 6,479,998 B1 * | 11/2002 | Yui et al. | 324/318 |
| 8,362,775 B2 * | 1/2013 | Nistler et al. | 324/318 |
| 8,749,235 B2 * | 6/2014 | Iwama et al. | 324/318 |
| 2007/0063705 A1 | 3/2007 | Ham | |

FOREIGN PATENT DOCUMENTS

| | | |
|---|---|---|
| JP | 2001-170026 A | 6/2001 |
| JP | 2001-327478 A | 11/2001 |
| JP | 2006-506155 A | 2/2006 |
| WO | 2004/046745 A1 | 6/2004 |

* cited by examiner

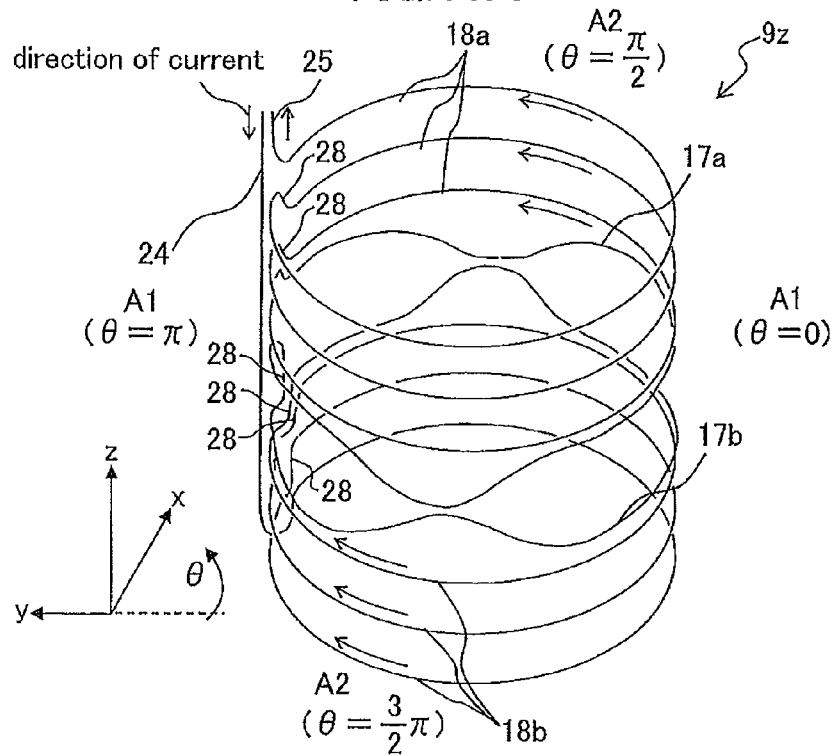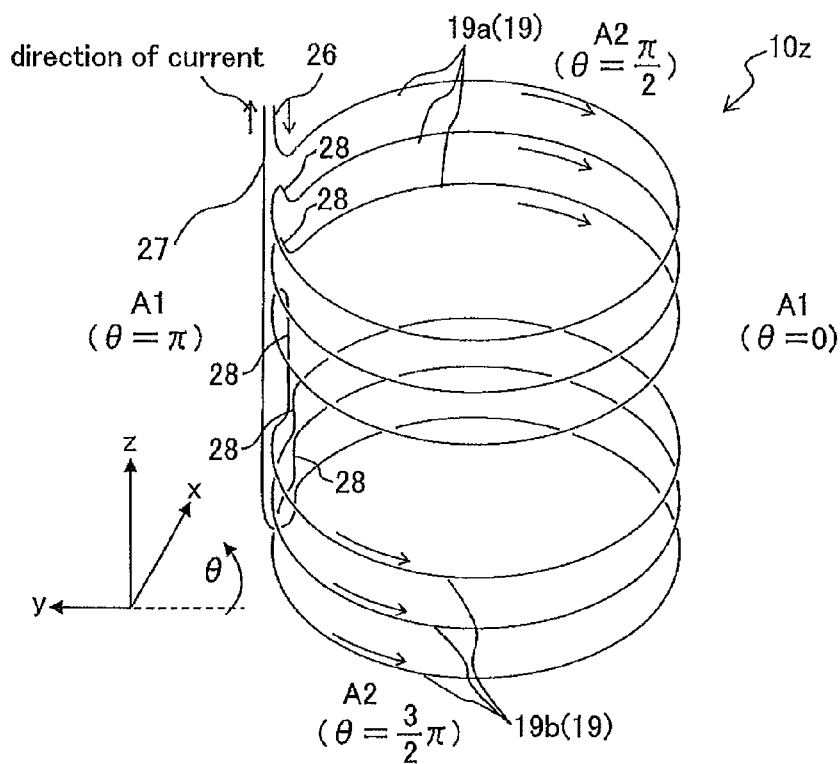

GRADIENT MAGNETIC FIELD COIL AND MAGNETIC RESONANCE IMAGING DEVICE

TECHNICAL FIELD

The present invention relates to a magnetic resonance imaging (hereinafter referred to as MRI) device, and particularly relates to a gradient magnetic field coil used for the MRI device.

BACKGROUND ART

As an MRI device, proposed is a horizontal magnetic field (tunnel type) MRI device that forms a horizontal magnetic field in an image capturing region. In this MRI device, a static magnetic field coil (such as a superconductive coil) for generating a uniform magnetic field in an image capturing region is housed in a hollow cylindrical housing. Inside the inner cylindrical wall surface (outside of the hollow cylindrical housing) of this hollow cylindrical housing, arranged are a gradient magnetic field coil for generating a pulse form magnetic field (a gradient magnetic field) for setting a position (information) in the image capturing region and an RF coil for exciting nuclear spins.

In an image capturing region of a horizontal magnetic field MRI device, a subject (usually a human body) is inserted into a static magnetic field generated by static magnetic field coils, the subject is irradiated with RF pulses generated by an RF coil, magnetic resonance signals thus generated from inside the body of the subject are received, and a tomogram image of the subject for medical diagnosis is thereby obtained. Herein, the gradient magnetic field coil includes a z-direction gradient magnetic field coil for generating a gradient magnetic field in the image capturing region where the subject is set, the gradient magnetic field linearly varying along the axis direction (z-axis direction) of the hollow cylindrical housing, an x-direction gradient magnetic field coil for generating a gradient magnetic field that linearly varies along the horizontal direction (x-axis direction) perpendicular to the z-axis and parallel to the floor, and a y-direction gradient magnetic field coil for generating a gradient magnetic field that linearly varies along the vertical direction (y-axis direction) perpendicular to the floor. Arrangement is made such that, by applying currents in a pulse form to the x-axis direction gradient magnetic field coil and the y-axis direction gradient magnetic field, the gradient magnetic field coil generates a magnetic field with gradients in the respective directions to provide magnetic resonance signals with information on positions inside the subject.

The gradient magnetic field coil also generates a magnetic field (a residual magnetic field) in a region other than the image capturing region, and the residual magnetic field generates eddy currents in the hollow cylindrical housing arrange around the residual magnetic field. There are cases where a magnetic field generated by the eddy currents causes bad effects on a tomogram image. Accordingly, in order to reduce the residual magnetic field, in addition to a main coil for generating the gradient magnetic fields, the gradient magnetic field coil is provided with a shield coil in which currents slow in directions opposite to the directions of currents in the main coil.

A gradient magnetic field coil is in general formed to have a cross section which is perpendicular to z-axis and in a circular shape such as to be along the inner cylindrical wall of a hollow cylindrical housing for housing a static magnetic field coil. However, in order to reduce a feeling of pressure for a subject, a patient for example, which occurs when the subject is inserted inside the surface of the inner cylindrical wall, it is proposed to change a circular cross-section to become horizontally long (refer to Patent Document 1, for example). In Patent Document 1, the cross-sections, which are perpendicular to the z-axis of the main coil and the shield coil of a gradient magnetic field coil, are formed in a horizontally-long elliptical shape. Further, in Patent Document 1, proposed is a gradient magnetic field coil that includes a main coil with an elliptical cross-section and a shield coil that is arranged outside the main coil and has a circular cross-section.

In Patent Document 2, proposed is a horizontal magnetic field MRI device with a gradient magnetic field coil having a cross-section in a non-circular shape. The main coil of this gradient magnetic field device has a cross-section, which is perpendicular to z-axis, whose lower half is a flattened arc and whose upper half is substantially circular. Patent Document 2 shows an example of the wiring patterns of a z-direction gradient magnetic field coil for generating a magnetic field with a linear gradient in the z direction, and shows a state that the winding density of the wiring pattern is different depending on whether the density is with respect to the upper side with a narrower gap between a main coil and a shield coil or with respect to the lower side with a wider gap.

BACKGROUND ART DOCUMENTS

Patent Documents

Patent Document 1: JP 2001-327478 A
Patent Document 2: JP 2001-170026 A

DISCLOSURE OF THE INVENTION

Problems to be Solved by the Invention

In a case that that the main coil and the shield coil, which are z-direction gradient magnetic field coils, have cross-sectional shapes that are coaxial circles, the main coil and the shield coil have wiring patterns of a solenoid form coil which the z-axis penetrates through.

On the other hand, as in Patent Document 2, in a case that a main coil, which is a z-direction gradient magnetic field coil, has a cross-section in a non-circular shape and a shield coil, which is a z-direction gradient magnetic field coil, has a cross-section in a circular shape, the gap between the main coil and the shield coil changes with circumferential direction so that a narrow region and a wide region are present. The magnetic field that one of the main coil and the shield coil generates in the region, where the other coil is arranged, is larger than in the narrow region than in the wide region. Therefore, as it is impossible to form the main coil and the shield coil only in wiring patterns of a solenoid form, a loop coil is additionally formed which goes over the cross-section, the cross-section including the center (device center) of a hollow cylindrical housing for housing a static magnetic field coil and being perpendicular to the z-axis, wherein z-axis does not penetrate through the loop coil. In such a manner, when both a solenoid form coil and a loop coil are present, an unnecessary magnetic field is generated by a crossover line for connecting the wiring patterns of the solenoid form coil and the loop coil.

As the magnetic field by the crossover line temporarily varies, eddy currents are induced in the surrounding hollow cylindrical housing, and it is understood that a magnetic field generated by the eddy currents causes bad effects on a tomogram image by the MRI device. Further, when a solenoid form coil and a loop coil are present in a mixture, the manufacturability at the connection section between them is worse. Still further, if attention is focused on the solenoid form coil portion, a case may occur that a circuit current path is not on the same plane, which requires providing a mechanism for ensuring processing accuracy.

In this situation, a first object of the present invention is to provide a gradient magnetic field coil and an MRI device including the gradient magnetic field coil, wherein, even when the gap between a main coil and a shield coil changes with circumferential direction and a narrow region and a wide region are present, the gradient magnetic field coil can be formed in a solenoid form with wiring patterns, without using a loop coil which the z-axis does not penetrates through.

Further, a second object of the present invention is to provide a gradient magnetic field coil and an MRI device including the gradient magnetic field coil, wherein, even in a case that the cross-sectional shape of a main coil, which is a z-direction gradient magnetic field coil, is non-circular while the cross-sectional shape of a shield coil, which is a z-direction gradient magnetic field coil, is circular (that is, even in a case that the gap between the main coil and the shield coil changes with circumferential direction and a narrow region and a wide region are present), a gradient magnetic field coil has coil patterns with which the main coil can be easily manufactured and does not include a mixture of a solenoid form coil and a loop coil.

Means for Solving the Problems

For attaining the above first object, according to the present invention, a gradient magnetic field coil includes:

a first coil (main coil) substantially in a solenoid form for generating a magnetic field distribution that is linear in an axis direction in an image capturing region of a magnetic resonance imaging device; and a second coil (shield coil) that is substantially in a solenoid form and is arranged outside the first coil (main coil) and inside a static magnetic field coil device for generating a static magnetic field with a uniform magnetic field distribution in the image capturing region, the second coil reducing a residual magnetic field from the first coil (main coil) to the static magnetic field coil device, wherein a gap between the first coil (main coil) and the second coil (shield coil) changes with circumferential direction, the gap including a first region (wide region) and a second region (narrow region) in which the gap is narrower than in the first region, and wherein the first coil (main coil) is arranged such that a wiring pattern that is on a side of zero plane, the zero plane including a center of the first coil (main coil) and being perpendicular to the axis direction, is serpentine in the circumferential direction such as to be distant from the zero plane in the wide region and is close to the zero plane in the narrow region.

Further, according to the present invention, an MRI device includes the gradient magnetic field coil and the static magnetic field coil device wherein the static magnetic field coil device is disposed adjacent to the gradient magnetic field coil.

For attaining the above second object, according to the present invention, a horizontal-magnetic-field MRI device includes:

a static magnetic field coil in a ring shape for generating a static magnetic field;

a bed device that moves a ring shaped opening of the static magnetic field coil; and a gradient magnetic field coil for generating a gradient magnetic field whose magnetic field strength has a gradient, wherein the gradient magnetic field coil includes:

a gradient magnetic field main coil (main coil) for generating the gradient magnetic field in an image capturing region; and a gradient magnetic field shield coil (shield coil) for reducing leakage of the generated gradient magnetic field to outside the gradient magnetic field coil, wherein a gap between the gradient magnetic field main coil and the gradient magnetic field shield coil changes with a circumferential direction, and wherein a z-gradient magnetic field main coil for generating the gradient magnetic field along a z-axis direction being a moving direction of the bed device has current flow paths each of which is on a plane perpendicular to the z-axis, and the z-gradient magnetic field main coil is a solenoid form coil formed by lamination of the current flow paths along the z-axis direction.

Advantages of the Invention

According to the first aspect of the invention, even when the gap between a main coil and a shield coil changes with circumferential direction and a narrow region and a wide region are present, it is possible to provide a gradient magnetic field coil, wherein wiring patterns can be formed, without using a loop coil which the z-axis does not penetrates through, and it is also possible to provide an MRI device having the gradient magnetic field coil mounted on it.

Further, according to the second aspect, it is possible to simplify the wiring of a conductor by forming a main coil, which is a z-gradient magnetic field coil, in a solenoid form with lamination of current flow paths along the z direction each of which is on a plane perpendicular to the z-axis. Still further, in the solenoid form coil, z position of a conductor is constant in the circumferential direction excluding the connection section for connection with neighboring patterns, and easy manufacturing is thereby attained. Further, as distortion of the magnetic field distribution generated by the z main coil in the image capturing region is small, it is possible to obtain information on cross sections with high accuracy in image capturing.

BRIEF DESCRIPTION OF THE DRAWINGS

FIG. 11A is at perspective view with transparency for showing the z main coil (the first coil) of the gradient magnetic field coil according to the first embodiment of the present invention;

FIG. 11B is a perspective view with transparency for showing the z shield coil (the second coil) of the gradient magnetic field coil according to the first embodiment of the present invention;

FIGS. 20A-20B show the z component of the magnetic flux density generated by a z-gradient magnetic field coil, wherein FIG. 20A shows a case of a z gradient magnetic field coil in the sixth embodiment of the present invention, FIG. 20B shows a case of a z gradient magnetic field coil of Comparison Example 2.

FIGS. 21A-21B show a portion of the wiring patterns of the z main coil in the sixth embodiment of the present invention, wherein FIG. 21A shows wiring patterns with illustration of the connection sections between elliptical electric current flow paths laminated along z direction, and FIG. 21B shows a portion of the conductor of the z main coil;

FIGS. 22A-22B show a portion of the wiring patterns of the z shield coil in the sixth embodiment of the present invention, wherein FIG. 22A shows wiring patterns to illustrate the connection section between elliptical electric current flow paths laminated in the z direction, and FIG. 22B shows a portion of the conductor of the z main coil;

FIGS. 23A-23C show z-gradient magnetic field coils in a seventh embodiment of the present invention, wherein FIG. 23A is a cross-sectional view of the z gradient magnetic field coils, FIG. 23B shows a half of a development view of the wiring patterns of the z main coil, which is a z gradient magnetic field coil, and FIG. 23C shows a half of a development view of the wiring patterns of the z shield coil;

FIGS. 24A-24C show z gradient magnetic field coils in an eighth embodiment of the present invention, wherein FIG. 24A is a cross-sectional view of the z gradient magnetic field coils, FIG. 24B shows a half of a development view of the wiring patterns of the z main coil, which is a z gradient magnetic field coil, and FIG. 24C shows a half of a development view of the wiring patterns of the z shield coil;

FIGS. 25A-25C show z gradient magnetic field coils in a ninth embodiment of the present invention, wherein FIG. 25A is a cross-sectional view of the z gradient magnetic field coils, FIG. 25B shows a half of a development view of the wiring patterns of the z main coil, which is a z gradient magnetic field coil, and FIG. 25C shows a half of a development view of the wiring patterns of the z shield coil; and FIGS. 26A-26C show z gradient magnetic field coils in a tenth embodiment of the present invention, wherein FIG. 26A is a cross-sectional view of the z gradient magnetic field coils, FIG. 26B shows a half of a development view of the wiring patterns of the z main coil, which is a z gradient magnetic field coil, and FIG. 26C shows a half of a development view of the wiring pattern of the z shield coil.

EMBODIMENTS FOR CARRYING OUT THE INVENTION

Embodiments of the present invention will be described below in detail, with reference to the drawings, as appropriate. The same symbol will be assigned to elements which are common to figures, and overlapping description will be omitted.

First Embodiment

Figure 2:
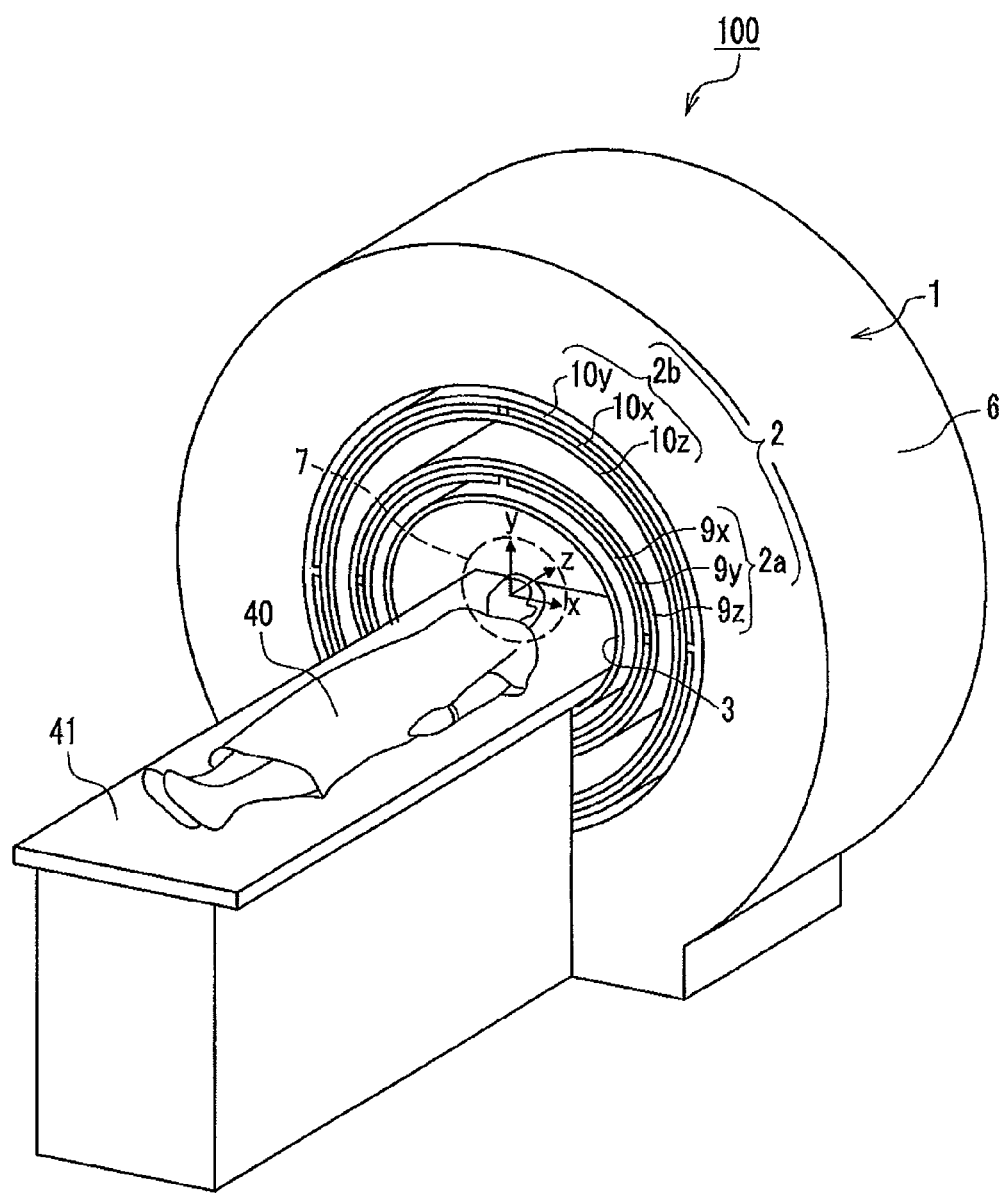
FIG. 2 shows a perspective view of a magnetic resonance imaging device according to the first embodiment of the present invention.

FIG. 2 shows a perspective view of a magnetic resonance imaging (MRI) device 100 according to the first embodiment of the present invention. The MRI device 100 includes a static-magnetic-field coil device 1 for generating a uniform static magnetic field in an image capturing region (image capturing space) 7 into which a subject 40 is inserted in a lying state on a bed 41, a gradient magnetic field coil 2 for generating, in a pulse form, a gradient magnetic field in which magnetic field strength is spatially gradient to provide position information to the image capturing region 7, an RF coil 3 for irradiating the subject 40 with high frequency pulses, a receiving coil (not shown) for receiving magnetic resonance signals from the subject 40, and a computer system (not shown) for processing the received magnetic resonance signals and displaying a tomogram image. Then, by the MRI device 100, utilizing a nuclear magnetic resonance phenomenon that occurs when the subject 40 placed in the uniform static magnetic field is irradiated with high frequency pulses, a tomogram image representing the physical and chemical characteristics of the subject 40 can be obtained, wherein the tomogram image is particularly used for a medical purpose. The static-magnetic-field coil device 1, the gradient magnetic field coil 2, and the RF coil 3 are in respective cylindrical shapes whose central axes are substantially the same with each other and along z-axis. Herein, the direction that is parallel to the entrance direction (the direction of the static magnetic field) of the bed 41 into inside the cylindrical shape is defined as z-axis. Incidentally, the y-axis direction is set upward in the vertical direction, while the x-axis direction is set horizontally toward the direction in which a screw moves when the screw is turned from the z-axis direction to the y-axis direction. The outer circumference of the static-magnetic-field coil device 1 is formed by a vacuum housing 6 that is a hollow cylindrical housing. The gradient magnetic field coil 2 and the RF coil 3 are arranged inside the inner cylindrical wall (, which is outside the hollow cylindrical housing,) of the vacuum housing 6, which is a hollow cylindrical housing.

The gradient magnetic field coil 2 includes a main coil 2a arranged on the image capturing region 7 side and a shield coil 2b arranged on the vacuum housing 6 side. The main coil 2a generates a gradient magnetic field in the image capturing region 7, but at the same time also generates a so-called residual magnetic field in the vacuum housing 6, which is a hollow cylindrical housing. In order to reduce the residual magnetic field into the vacuum housing 6, which is a hollow cylindrical housing, it is arranged such that a current flows in the shield coil 2b in a direction opposite to the direction of a current flowing in the main coil 2a.

The main coil 2a includes a z main coil 9z for generating a gradient magnetic field that varies linearly in the z-axis direction, an x main coil 9x for generating a gradient magnetic field that varies linearly in the x-axis direction, and a y main coil 9y for generating a gradient magnetic field that varies linearly in the y-axis direction. By applying respective pulse form currents to the z main coil 9z, the x main coil 9x, and the y main coil 9y, it is possible to a generate gradient magnetic field that is gradient in the respective directions, and attach information on a position inside the subject 40 to each corresponding magnetic resonance signal.

The shield coil 2b includes a z shield coil 10z for reducing the residual magnetic field generated by the z main coil 9z, an x shield coil 10x for reducing the residual magnetic field generated by the x main coil 9x, and a y shield coil 10y for reducing the residual magnetic field generated by the y main coil 9y.

Figure 3:
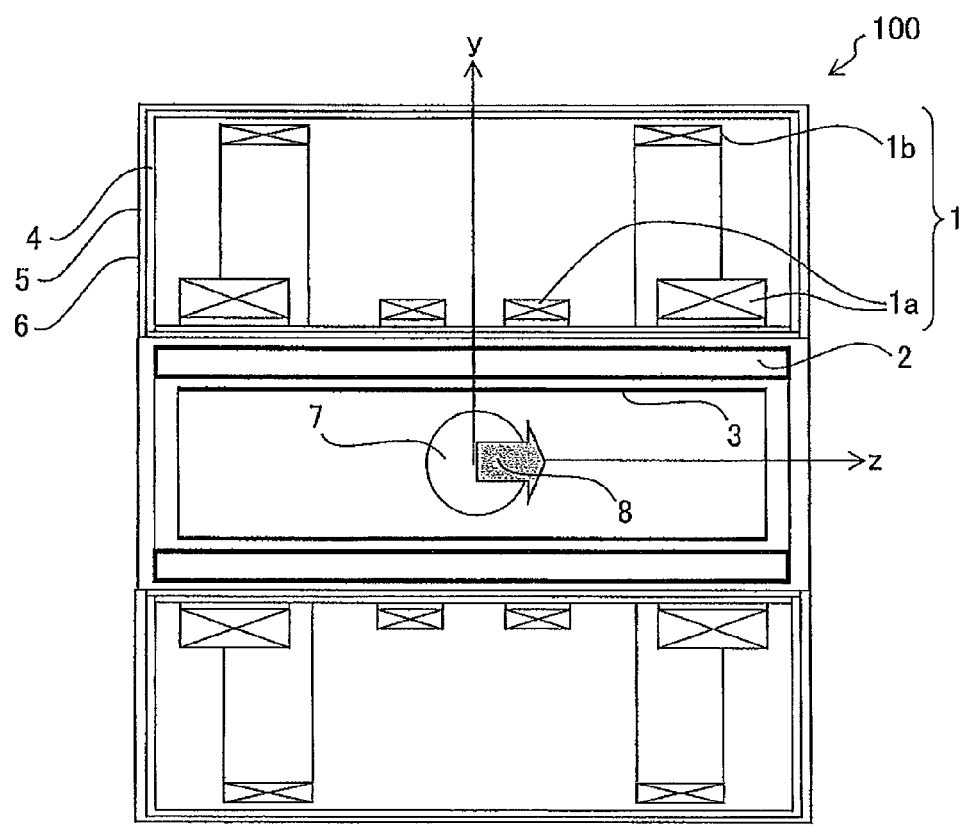
FIG. 3 is a cross-sectional view of the magnetic resonance imaging device according to the first embodiment of the present invention, obtained by cutting the device with a plane including the y-axis and the z-axis.

FIG. 3 is a cross-sectional view of the MRI device 100 according to the first embodiment of the present invention, obtained by cutting the MRI device 100 with a plane including y-axis and z-axis. The MRI device 100 is a horizontal magnetic field MRI device, wherein the direction of a static magnetic field 8 formed in the image capturing region 7 is the horizontal direction (z-axis direction). Further, as described above, x-axis, y-axis, and z-axis are set such as to be perpendicular to each other, and the origin is set near the center of the image capturing region 7, in other words, near the center of the vacuum housing 6, which is a hollow cylindrical housing. The static-magnetic-field coil device 1 is provided with static-magnetic-field main coils 1a, and static-magnetic-field shield coils 1b for reducing leakage of a static magnetic field to the periphery, such that the static-magnetic-field coils 1a and the static-magnetic-field shield coils 1b are respectively right-left (portions z<0 and z>0) symmetric with respect to z=0 plane. These coils 1a, 1b are in annular shapes with z-axis as the common central axis. The inner diameters of the static-magnetic-field shield coils 1b are larger than the outer diameters of the static-magnetic-field main coils 1a. In most cases, superconductive coils are used for these coils 1a, 1b, wherein the coils 1a, 1b are housed in a housing with a three-layer structure. First, the coils 1a, 1b are housed in a helium container 4 together with liquid helium (He) as refrigerant. The helium container 4 is housed in a radiation shield 5 for shielding heat radiation into inside the helium container 4. The vacuum housing 6, which is a hollow cylindrical housing, houses the helium container 4 and the radiation shield 5, while maintaining the inside thereof vacuum. As the inside of the vacuum housing 6 is maintained vacuum, even when the vacuum housing 6 is set in a room of a normal room temperature, it does not occur that the heat inside the room is transferred to the helium container 4 by conduction or convection. Further, the radiation shield 5 reduces transfer of the heat in the room through the vacuum housing 6 to the helium container 4 by radiation. Accordingly, the coils 1*a*, 1*b* can be set stably at an ultralow temperature, which is the temperature of the liquid helium, to enable a function as a superconductive electromagnet. In order that an unnecessary magnetic field is not generated, nonmagnetic materials are employed for the helium container 4, the radiation shield 5, and the vacuum housing 6, and more particularly, nonmagnetic metals are employed for easy maintenance of vacuum. Accordingly, the helium container 4, the radiation shield 5, and particularly, the vacuum housing 6 disposed at the outermost circumference, are in a state that eddy currents are easily generated.

The gradient magnetic field coil 2 has a cylindrical shape and is arranged such as to surround the RF coil 3 and the image capturing region 7 therein. The outer cylindrical wall of the gradient magnetic field coil 2 is formed such as to face the inner cylindrical wall of the vacuum housing 6, which is a hollow cylindrical container 6, along the wall.

The RF coil 3 also has a cylindrical shape and is arranged such as to surround the image capturing region 7 therein. The outer cylindrical wall of the RF coil 3 is formed such as to be along the inner cylindrical wall of the gradient magnetic field coil 2, facing it. The RF coil 3 irradiates the image capturing region 7 with high frequency pulses. A receiving coil (not shown) receives magnetic resonance signals from the subject 40 and transmits the signals to the computer system (not shown). Upon receipt of the magnetic resonance signals from the receiving coil, the computer system processes the magnetic resonance signals, thereby creates a tomogram image of the subject 40, and displays the image on a display device (not shown).

Figure 4:
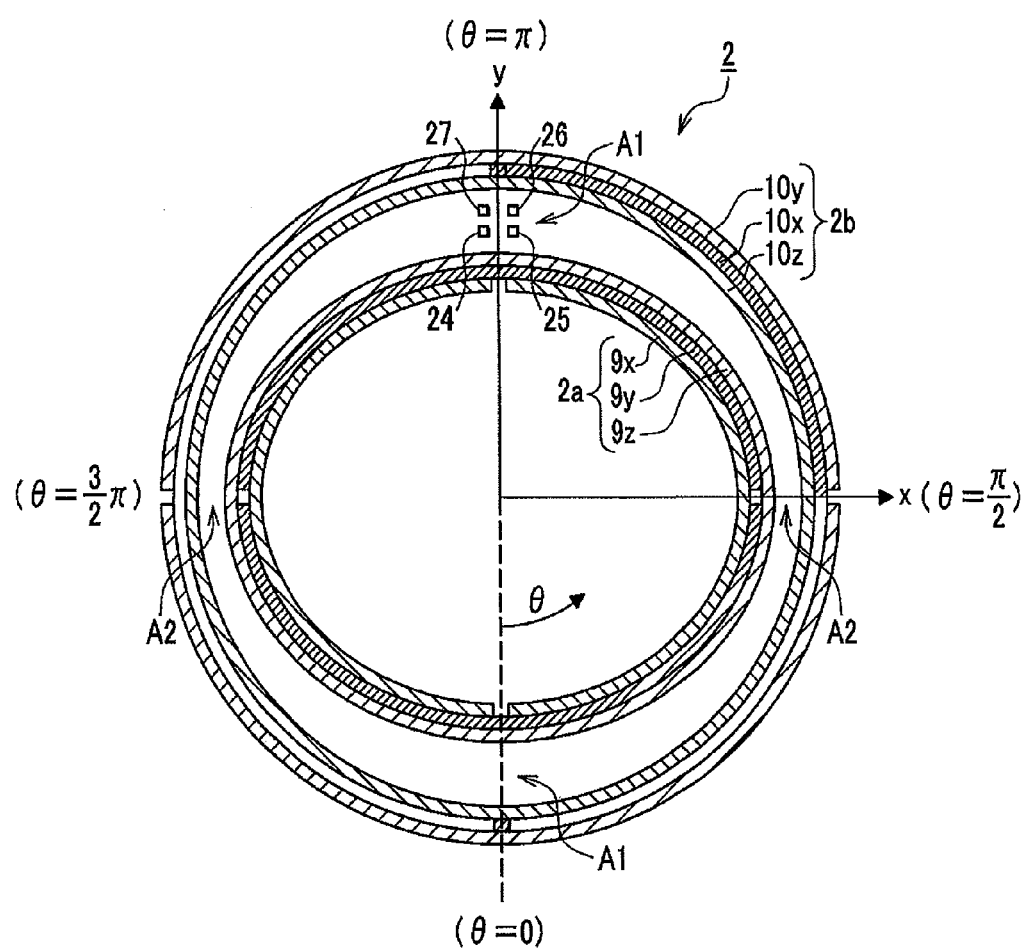
FIG. 4 is a cross-sectional view of the gradient magnetic field coil according to the first embodiment of the present invention, obtained by cutting the coil with a plane including the x-axis and the y-axis.

FIG. 4 is a cross-sectional view of the gradient magnetic field coil 2 according to the first embodiment of the present invention, obtained by cutting the coil 2 with a plane including x-axis and y-axis. The (gradient magnetic field) shield coil 2*b* is disposed outside the (gradient magnetic field) main coil 2*a*. The cross-sectional shape of the (gradient magnetic field) main coil 2*a* is elliptical, while the cross-sectional shape of the (gradient magnetic field) shield coil 2*b* is (truly) circular. The central axis of the (gradient magnetic field) main coil 2*a* and the central axis of the (gradient magnetic field) shield coil 2*b* are in z-axis direction and agree with each other. The (gradient magnetic field) main coil 2*a* has a long axis in the x-axis direction and a short axis in the y-axis direction. Accordingly, the gap between the main coil 2*a* and the shield coil 2*b* changes with circumferential direction ($\theta$ direction), and forms first regions (wide regions) A1, and second regions (narrow regions) A2 where the gap between the main coil 2*a* and the shield coil 2*b* is narrower than in the wide regions A1. The first region (wide region) A1 is formed, extending from the short axis of the ellipse of the (gradient magnetic field) main coil 2*a*, and the second region (narrow region) A2 is formed, extending from the long axis of the ellipse of the (gradient magnetic field) main coil 2*a*. Angle $\theta$ is an angle around z-axis. The Y-axis negative direction from the origin of coordinates is defined as zero radian ($\theta=0$ rad). Likewise, the x-axis positive direction is defined as $\pi/2$ radian ($\theta=\pi/2$ rad). The Y-axis positive direction is defined as $\pi$ radian ($\theta=\pi$ rad). The x-axis negative direction is defined as $3\pi/2$ radian ($\theta=3\pi/2$ rad). Thus, the wide regions A1 are formed in areas with $\theta$ of zero radian ($\theta=0$ rad), $\pi$ radian ($\theta=\pi$ rad), and the vicinities of them. In reverse, the narrow regions A2 are formed in areas with $\theta$ of $\pi/2$ radian ($\theta=\pi/2$ rad), $3\pi/2$ radian ($\theta=3\pi/2$ rad), and the vicinities of them.

In one of the wide regions A1, where the gap between the main coil 2*a* and the shield coil 2*b* is wide, and is on the side where $\theta$ is $\pi$ radian ($\theta=\pi$ rad), connection wires 24, 25 for connecting an external power source and the main coil 2*a* are provided. Further, in this wide region A1, connection wires 26, 27 for connecting an external power source and the shield coil 2*b* are provided. As the region A1 is wide, it is easy to arrange the connection wires 24-27.

The x main coil 9*x*, the y main coil 9*y*, and the z main coil 9*z* of the main coil 2*a* are laminated with insulation layers, not shown, therebetween. The x shield coil 10*x*, the y shield coil 10*y*, and the z shield coil 10*z* of the shield coil 2*b* are also laminated with insulation layers, not shown, therebetween.

Figure 5A:
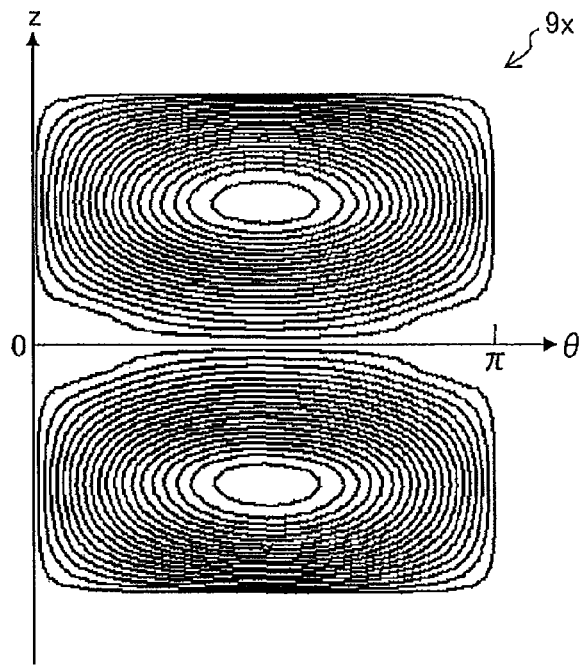
FIG. 5A shows a half of a development view of the wiring patterns of the x main coil of the gradient magnetic field coil according to the first embodiment of the present invention.

FIG. 5A shows a half of a development view, along the $\theta$ direction, of the wiring patterns of the x main coil 9*x* of the main coil 2*a* of the gradient magnetic field coil 2 according to the first embodiment of the present invention. That is, FIG. 5A shows the range of $\theta$ from 0 to $\pi$ radian, and the range of $\pi$ to $2\pi$ radian is not shown. The wiring patterns of the x main coil 9*x* in the range where $\theta$ is in the range $\pi$ to $2\pi$ are wiring patterns that are those turned from, in other words axisymmetric to, the wiring patterns of the x main coil 9*x* that are in the range where $\theta$ is 0 to $\pi$ radian with respect to the line, as the symmetric axis, with $\theta$ of $\pi$ radian ($\theta=\pi$) parallel to the z-axis. Thus, it is recognized that the x main coil 9*x* includes four whorled-saddle-form loop coils.

Figure 5B:
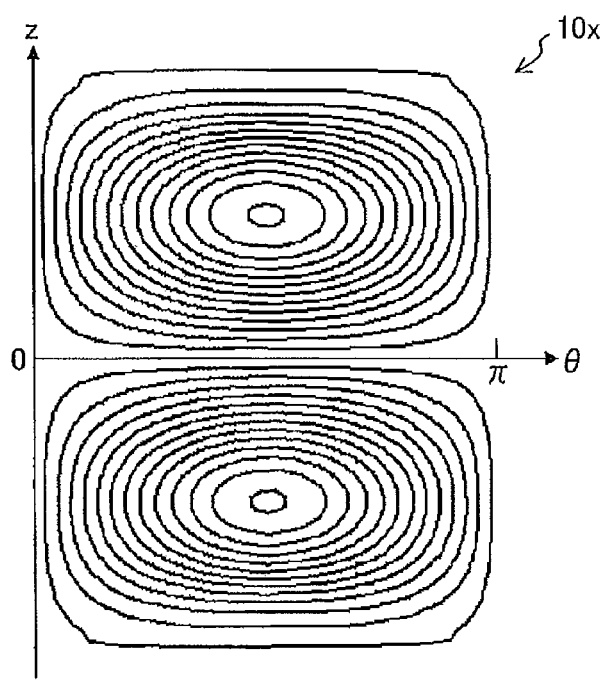
FIG. 5B shows a half of a development view of the wiring patterns of the x shield coil of the gradient magnetic field coil according to the first embodiment of the present invention.

FIG. 5B shows a half of a development view, along the $\theta$ direction, of the wiring patterns of the x shield coil 2*b* of the gradient magnetic field coil 2 according to the first embodiment of the present invention. That is, FIG. 5B shows the range of $\theta$ from 0 to $\pi$ radian, and the range of $\pi$ to $2\pi$ radian is not shown. The wiring patterns of the x shield coil 10*x* in the range where $\theta$ is in the range $\pi$ to $2\pi$ are wiring patterns that are those turned from, in other words, axisymmetric to, the wiring patterns of the x shield coil 10*x* that are in the range where $\theta$ is 0 to $\pi$ radian with respect to the line, as the symmetric axis, with $\theta$ of $\pi$ radian ($\theta=\pi$) parallel to the z-axis. Thus, it is recognized that the x shield coil 10*x* includes four whorled-saddle-form loop coils.

Figure 6A:
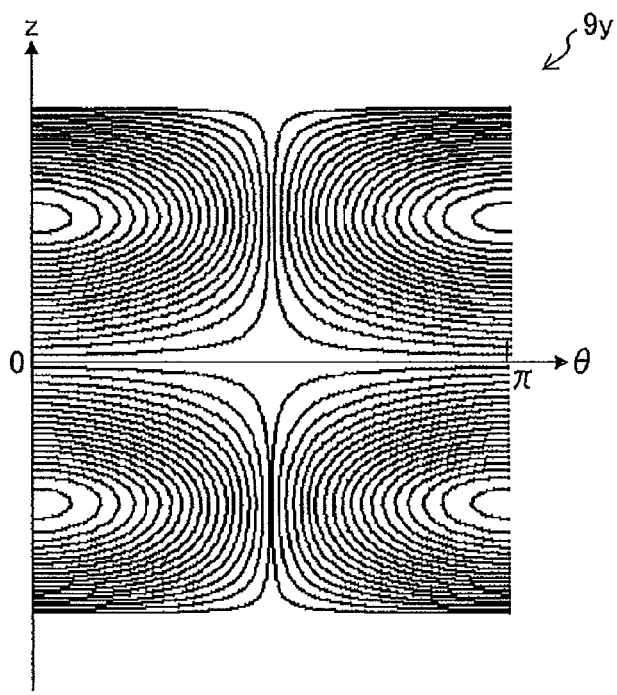
FIG. 6A shows a half of a development view of the wiring patterns of the y main coil of the gradient magnetic field coil according to the first embodiment of the present invention.

FIG. 6A shows a half of a development view, along the $\theta$ direction, of the wiring patterns of the y main coil 9*y* of the main coil 2*a* of the gradient magnetic field coil 2 according to the first embodiment of the present invention. FIG. 6A also shows the range of $\theta$ from 0 to $\pi$ radian, and the range of $\pi$ to $2\pi$ radian is not shown. The wiring patterns of the y main coil 9*y* in the range where $\theta$ is in the range $\pi$ to $2\pi$ are wiring patterns that are those turned from, in other words, axisymmetric to the wiring patterns of the y main coil 9*y* that are in the range where $\theta$ is 0 to $\pi$ radian, with respect to the line, as the symmetric axis, with $\theta$ of $\pi$ radian ($\theta=\pi$) parallel to the z-axis. Thus, it is recognized that the y main coil 9*y* includes four whorled-saddle-form loop coils. The y main coil 9*y* substantially agrees with one turned from the x main coil 9*x* rotated by 90 degrees around z-axis.

Figure 6B:
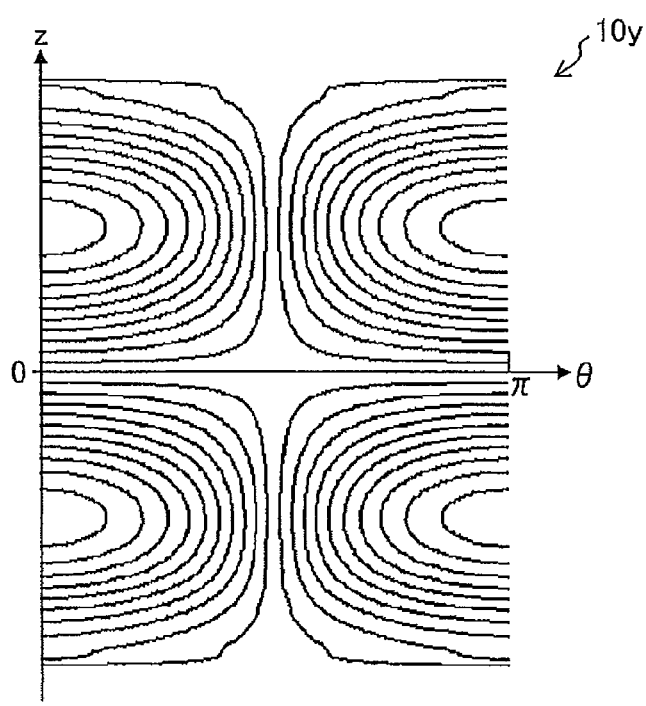
FIG. 6B shows a half of a development view of the wiring patterns of the y shield coil of the gradient magnetic field coil according to the first embodiment of the present invention.

FIG. 6B shows a half of a development view, along the $\theta$ direction, of the wiring patters of the y shield coil 10*y* of the shield coil 2*b* of the gradient magnetic field coil 2 according to the first embodiment of the present invention. FIG. 6B also shows the range of $\theta$ from 0 to $\pi$ radian, and the range of $\pi$ to $2\pi$ radian is not shown. The wiring patterns of the y shield coil 10*y* in the range where $\theta$ is in the range $\pi$ to $2\pi$ are wiring patterns that are those turned from, in other words, axisymmetric to the wiring patterns of the y shield coil 10*y* that are in the range where $\theta$ is 0 to $\pi$ radian, with respect to the line, as the symmetric axis, with $\theta$ of $\pi$ radian ($\theta=\pi$) parallel to the z-axis. Thus, it is recognized that the y shield coil 10y includes four whorled-saddle-form loop coils. The y shield coil 10y substantially agrees with one turned from the x shield coil 10x rotated by 90 degrees around z-axis.

In such a manner, each of the x main coil 9x, the x shield coil 10x, the y main coil 9y, and the y shield coil 10y is constructed with four whorled-saddle-form loop coils. Regarding the multiple loop coils constructing the whorled loop coils, crossover lines for connecting adjacent loop coils are not shown.

Figure 1A:
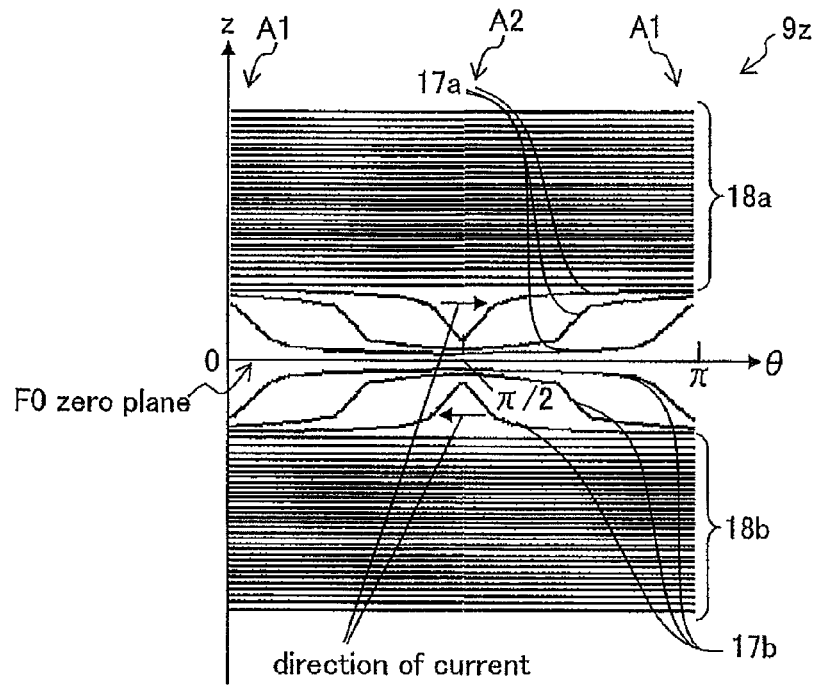
FIG. 1A shows a half of a development view of the wiring patterns of the z main coil (the first coil) of a gradient magnetic field coil according to a first embodiment of the present invention.

FIG. 1A shows a half of a development view, along the θ direction, of the wiring patterns of the z main coil (the first coil) of the main coil 2a of the gradient magnetic field coil 2 according to a first embodiment of the present invention. FIG. 1A shows the range of θ from 0 to π radian, and the range of π to 2π radian is not shown. The wiring patterns of the z main coil (the first coil) 9z in the range where θ is in the range π to 2π is a wiring pattern that are those turned from, in other words, axisymmetric to the wiring patterns of the z main coil (the first coil) 9z that are in the range where θ is 0 to π radian, with respect to the line, as the symmetric axis, with θ of π radian (θ=π) parallel to the z-axis. Thus, it is recognized that the z main coil (the first coil) 9z is a coil substantially in a solenoid form through which z-axis penetrates. The z main coil (the first coil) 9z forms a magnetic field distribution in the image capturing region 7 of the MRI device 100, wherein the strength is linearly gradient along the axis direction (z-axis direction) in the magnetic field distribution.

In the z main coil (the first coil) 9z, wiring patterns 17a, 17b (six wiring patterns in FIG. 1A) that are on a zero plane F0 (plane z=0) side which includes the center of the z main coil (the first coil) 9z and is perpendicular to the axis direction (z-axis direction) are serpentine along the circumferential direction (direction θ) such as to be distant from the zero plane F0 (plane z=0) in the wide regions A1 (the vicinities of θ=0, π) and is close to the zero plane F0 (plane z=0) in the narrow region A2 (nearly θ=π/2).

Out of the six wiring patterns of the wiring patterns 17a, 17b, the two wiring patterns which are the closest to the zero plane F0 (plane z=0) and on the both sides of the zero plane F0 (plane z=0) are close to the zero plane F0 (plane z=0) in the most of the regions along the circumferential direction (direction θ) including the narrow region A2 (nearly θ=π/2), excluding the wide regions A1 (the vicinities of θ=0, π). Accordingly, these two wiring patterns are displaced in the z-axis direction in the wide regions A1 (the vicinities of θ=0, π).

Out of the six wiring patterns of the wiring patterns 17a, 17b, the two wiring patterns which are the most distant from the zero plane F0 (plane z=0) and on the both sides of the zero plane F0 (plane z=0) are distant from the zero plane F0 (plane z=0) and close to the wiring patterns 18a, 18b in the most of regions along the circumferential direction (direction θ) including the wide regions A1 (the vicinities of θ=0, π), and are close to the zero plane F0 (plane z=0) only in the narrow region A2 (nearly θ=π/2). Accordingly, these two wiring patterns are displaced in the z-axis direction in the narrow region A2 (nearly θ=π/2).

Out of the six wiring patterns 17a, 17b, the wiring patterns, which are disposed between the two wiring patterns that are the closest to the zero plane F0 (z=0 plane) and on the both sides with respect to the zero plane F0 (z=0 plane) and the two wiring patterns that are the most distant form the zero plane F0 (z=0 plane) and on the both sides with respect to the zero plane F0 (z=0 plane), are close to the wiring patterns 18a, 18b and distant from the zero plane F0 (z=0 plane) in the peripheral region including the wide regions A1 (the vicinities of θ=0, π), and are close to the zero plane F0 (z=0 plane) in the peripheral region including the narrow region A2 (nearly θ=π/2). Accordingly, these two wiring patterns are displaced along z-axis direction in the region between the wide regions A1 (the vicinities of θ=0, π) and the narrow region A2 (nearly θ=π/2).

The z main coil (first coil) 9z also includes the outer wiring patterns 18a, 18b, which are distant from the zero plane F0 (z=0 plane). The wiring patterns 18a, 18b are substantially linear in the circumferential direction (θ direction) and are respectively plural wiring patterns.

The direction of a current applied to the wiring patterns 17a, 18a on the positive side with respect to z-axis is in the positive direction with respect to θ direction, and the direction of a current applied to the wiring patterns 17b, 18b on the negative side with respect to z-axis is in the negative direction with respect to θ direction. Crossover lines connecting the adjacent wiring patterns 17a, 17b, 18a, 18b are not shown.

Figure 1B:
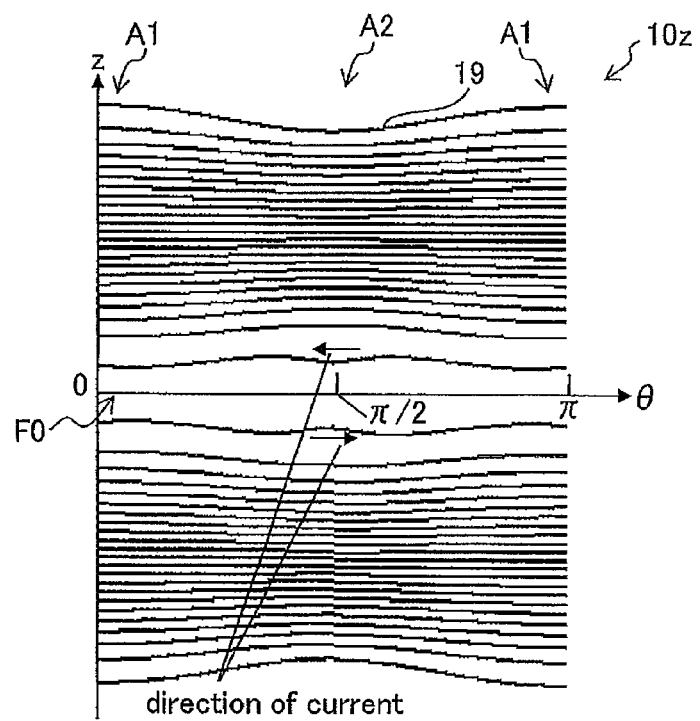
FIG. 1B shows a half of a development view of the wiring patterns of the z shield coil (the second coil) of the gradient magnetic field coil according to the first embodiment of the present invention.

FIG. 1B shows a half of a development view, along the θ direction, of the wiring patterns of the z shield coil (second coil) of the shield coil 2b of the gradient magnetic field coil 2 according to the first embodiment of the present invention. That is, FIG. 1B shows the range where θ is 0-π radian, and the range where θ is π to 2π radian is not shown. The wiring patterns of the z shield coil (second coil) 10z in the range where θ is π to 2π are wiring patterns that are those turned from, in other words axisymmetric to the wiring patterns of the z shield coil (second coil) 10z that are in the range where θ is 0 to π radian, with respect to the line, as the symmetric axis, with θ of π radian (θ=π) parallel to the z-axis. It is recognized that the z shield coil (second coil) 10z is a coil substantially in a solenoid form which z-axis penetrates through. Outside the z main coil (first coil) 9z, the z shield coil (second coil) 10z reduces a residual magnetic field from the z main coil (first coil) 9z to the static-magnetic-field coil device 1.

Out of wiring patterns 19 of the z shield coil (second) 10z, wiring patterns on the outer sides with respect to axis direction (z-axis direction) and on the side of the zero plane F0 (z=0 plane) are smoothly serpentine. Compared with other regions, the wiring patterns 19 are biased toward the zero plane F0 (z=0 plane) in the narrow region A2 (nearly θ=π/2) of the wiring patterns and the peripheral region along the circumferential direction (θ direction), the regions being on the outer sides with respect to the axis direction (z-axis direction). Compared with other regions, the wiring patterns 19 are biased toward the zero plane F0 (z=0 plane) in the wide regions A1 (the vicinities of θ=0, π) of the wiring patterns and the peripheral region along the circumferential direction (θ direction), the regions being on the zero plane F0 (z=0 plane) side. A current applied to the wiring patterns 19 on the positive side of z-axis is in the negative direction with respect to θ direction, and a current applied to the wiring patterns 19 on the negative side of z-axis is in the positive direction with respect to θ direction.

Figure 7:
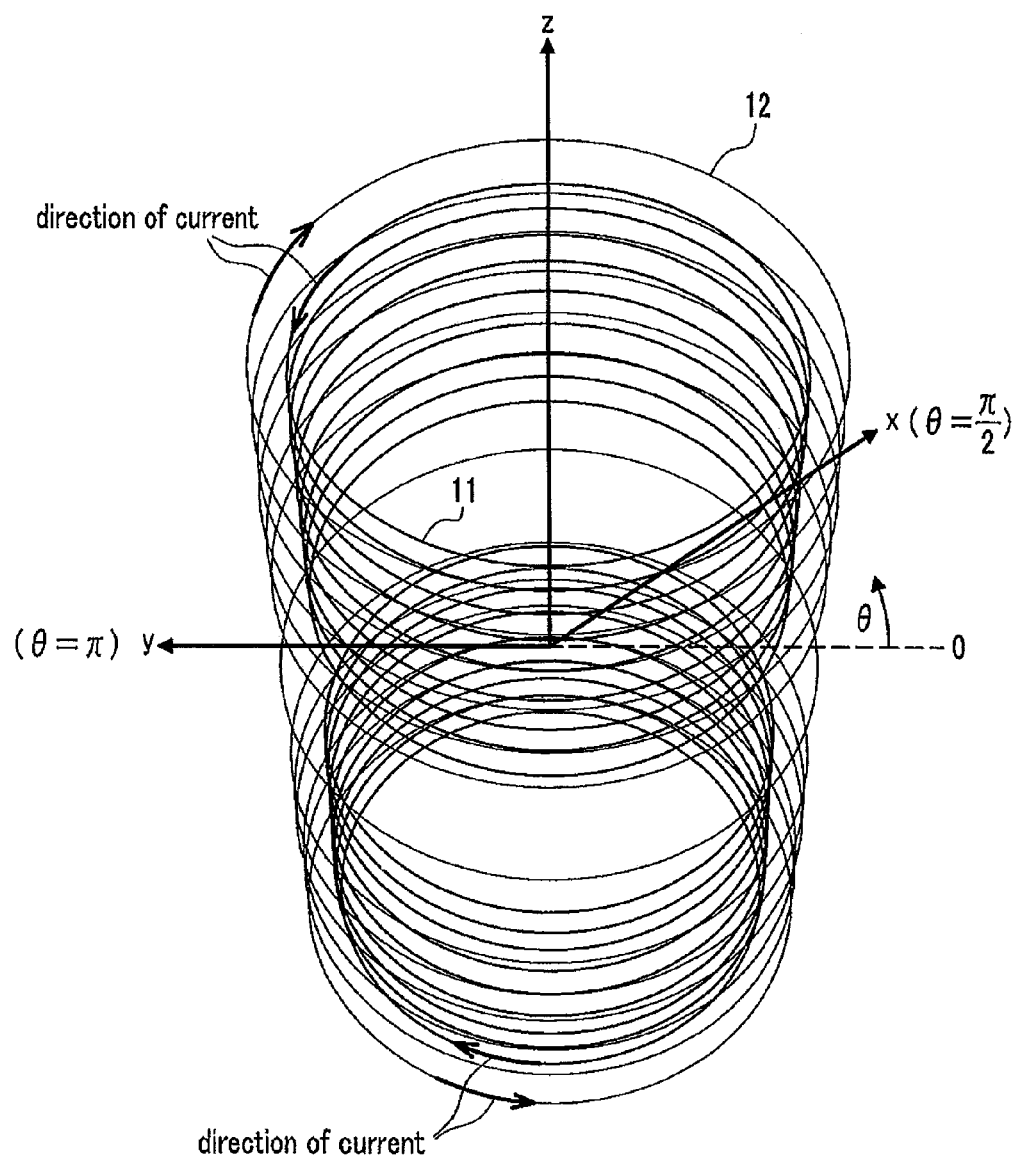
FIG. 7 is a perspective view with transparency for showing the z main coil and the z shield coil of a gradient magnetic field coil of Comparison Example 1.

FIG. 7 is a perspective view with transparency for showing the z main coil 11 and the z shield coil 12 of a gradient magnetic field coil in Comparison Example 1. In Comparison Example 1, the z main coil 11 and the z shield coil 12 with z-axis as a common central axis are used, and the cross-sections of the z main coil 11 and the z shield coil 12 on a plane perpendicular to z-axis are circular. Accordingly, the gap between the z main coil 11 and the z shield coil 12 is constant in the circumferential direction, wherein there is neither a wide region A1 nor a narrow region A2.

Figure 8A:
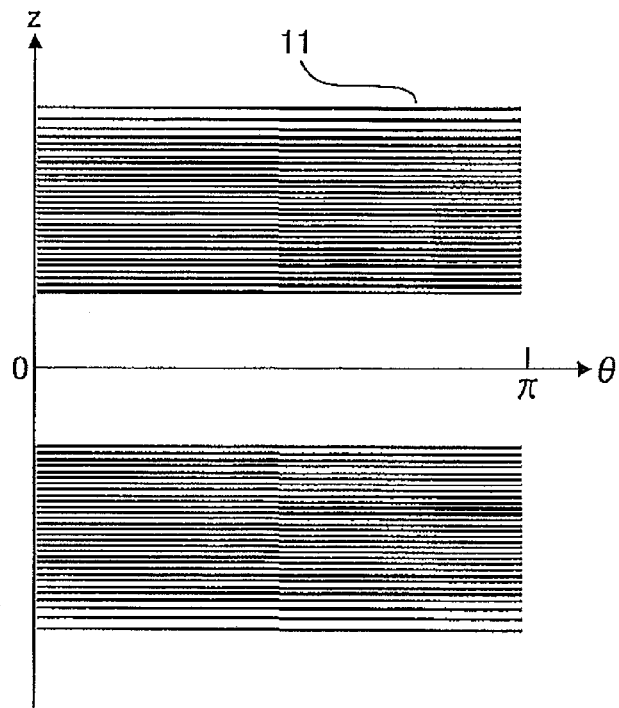
FIG. 8A shows a half of a development view of the wiring patterns of the z main coil of the gradient magnetic field coil of Comparison Example 1.
Figure 8B:
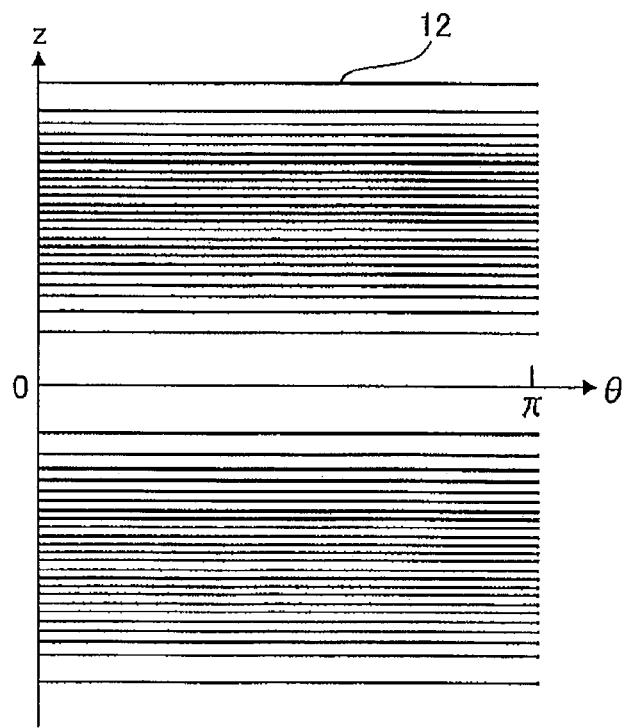
FIG. 8B shows a half of a development view of the wiring patterns of the z shield coil of the gradient magnetic field coil of Comparison Example 1.

FIG. 8A shows a half of a development view of the wiring patterns of the z main coil 11 of the gradient magnetic field coil in Comparison Example 1. FIG. 8B shows a half of a development view of the wiring patterns of the z shield coil of the gradient magnetic field coil in Comparison Example 1. In Comparison Example 1, the cross-sectional shapes of the z main coil 11 and the z shield coil 12 are both circular, and as the gap between the z main coil 11 and the z shield coil 12 is uniform (constant) with respect to the circumferential direction, the wiring patterns are also constant patterns in the circumferential direction ($\theta$ direction), are substantially linear in the circumferential direction ($\theta$ direction), and are plural wire patterns.

Figure 9A:
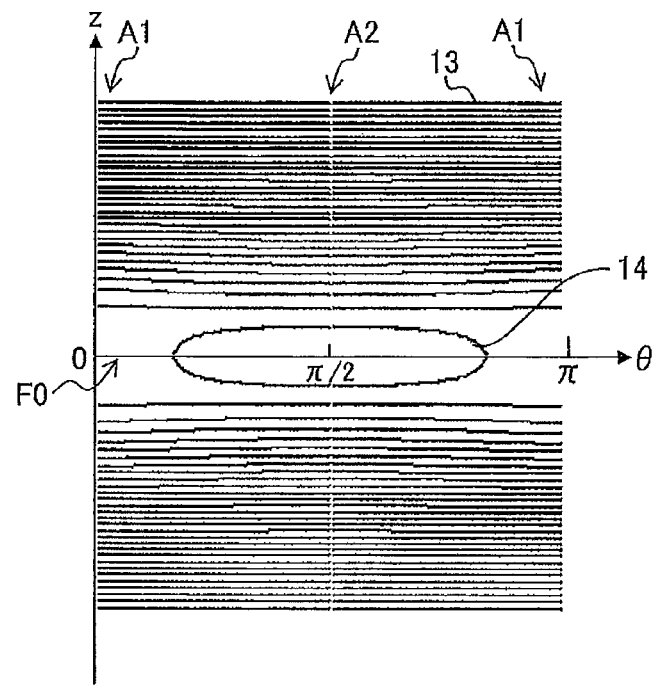
FIG. 9A shows a half of a development view of the wiring patterns of the z main coil of a gradient magnetic field coil of Comparison Example 2.
Figure 9B:
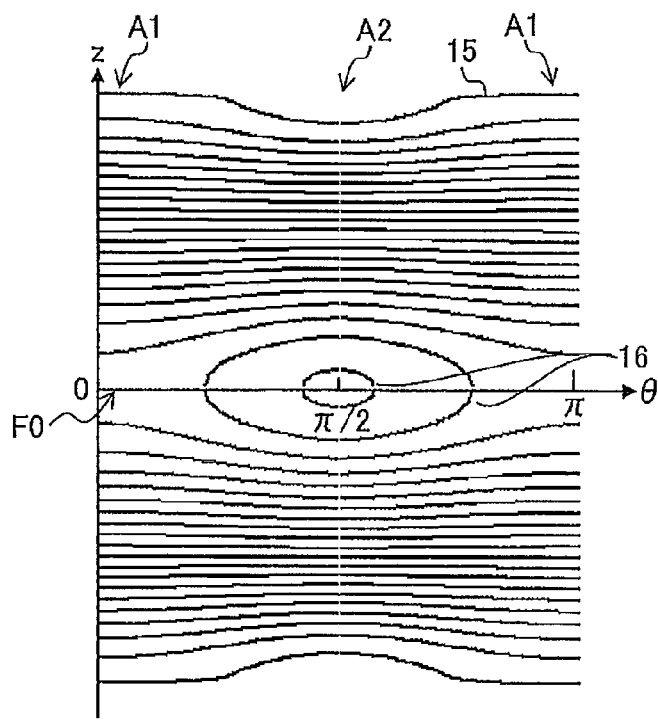
FIG. 9B shows a half of a development view of the wiring patterns of the z shield coil of the gradient magnetic field coil of Comparison Example 2.

FIG. 9A shows a half of a development view of the wiring patterns 13, 14 of the z main coil of a gradient magnetic field coil in Comparison Example 2. FIG. 9B shows a half of a development view of the wiring patterns 15, 16 of the z shield coil of the gradient magnetic field coil of Comparison Example 2. Similarly to the z main coil 9z and the z shield coil 10z, shown in FIG. 4, in the first embodiment, the gap between a z main coil 9z and a z shield coil 10z, in Comparison Example 2, changes with circumferential direction, wherein there are wide regions A1 and narrow regions A2. A magnetic field that is generated by one of the z main coil 9z and the z shield coil 10z, at a position where the other coil is disposed, is stronger in the case of the narrow regions A2 than in the case of the wide regions A1. In order that this magnetic field can be cancelled by the other coil (in order that the strength can be reproduced (in the reversal direction)), a loop coils across the zero plane F0 (z=0 plane) are formed, as the wiring pattern 14 for the z main coil 9z, and as the wiring pattern 16 for the z shield coil 10z. Z-axis does not penetrate through the loop coils of the wiring pattern 14 and the wiring pattern 16. The wiring patterns 13 of the z main coil 9z other than the wiring pattern 14, and wiring patterns 15 of the z shield coil 10z other than the wiring pattern 16, form coils that are substantially in a solenoid form and serpentine in the circumferential direction ($\theta$ direction) on a cylindrical surface or an ellipsoidal surface.

Loop coils were formed as the wiring pattern 14 in FIG. 9A and the wiring pattern 16 in FIG. 9B in Comparison Example 2. On the other hand, in the first embodiment, loop coils, through which z-axis does not penetrate, are not formed as shown by the z main coil 9z in FIG. 1A and by the z shield coil 10z in FIG. 1B. Thus, in the first embodiment, successfully, a loop coil through which z-axis does not penetrate, was not formed for the main coil 9z in FIG. 1A nor for the z shield coil 10z in FIG. 1B.

First, a magnetic field generated by the wiring patterns 17a, 17b, 18a, 18b of the z main coil 9z in FIG. 1A will be described below in detail. In the region where the z coordinate is positive (z>0), the direction of current in the wiring pattern 17a and the wiring pattern 18a is the positive direction with respect to $\theta$ direction, and in the region where the z coordinate is negative (z<0), the direction of current in the wiring pattern 17a and the wiring pattern 18a is the negative direction with respect to $\theta$ direction. Accordingly, the z component of the magnetic flux density is zero (0) (T) on the zero plane F0 (z=0 plane). A gradient magnetic field is generated such that the more distant from the zero plane F0 (z=0 plane), the larger the z component of the magnetic flux density.

In the wide regions A1 (nearly $\theta=0, \pi$), as the serpentine wiring pattern 17a passes by the wiring pattern 18a and the serpentine 17b passes by the wiring pattern 18b, the wiring pattern 17a and the wiring pattern 17b are distant from each other. Accordingly, this acts such that magnetic fields generated by the wiring pattern 17a and the wiring pattern 17b are not cancelled by each other, and the magnetic fields (magnetic gradient fields and residual magnetic fields) generated by the wiring patterns 17a, 18a and the wiring patterns 17b, 18b are strengthened.

On the other hand, in the narrow region A2 (nearly $\theta=\pi/2$), the serpentine wiring pattern 17a and wiring pattern 17b are close to each other. Accordingly, this acts such that magnetic fields generated by the wiring pattern 17a and the wiring pattern 17b are cancelled by each other, and the magnetic fields (magnetic gradient fields and residual magnetic fields) generated by the wiring patterns 17a, 18a and the wiring patterns 17b, 18b are not strengthened.

Thus, the profile of the magnetic field with respect to $\theta$ direction at a position that is distant by a certain length from the z main coil 9z toward the outer z shield coil 10z is larger in the wide regions A1 (nearly $\theta=0, \pi$) than in the narrow region A2 (nearly $\theta=\pi/2$). In other words, in comparison with the case of a magnetic field (a residual magnetic field) at a certain distance from the z main coil 9z in the narrow region A2 (nearly $\theta=\pi/2$), a position where a magnetic field (a residual magnetic field) with the same strength in the wide regions A1 (nearly $\theta=0, \pi$) as the above-described magnetic field (the residual magnetic field) in the narrow region A2 is present at a larger distance from the z main coil 9z than the above-described certain distance in the narrow region A2. That is, in a region that is outside the z main coil 9z and distant from the z main coil 9z, an annular region is present where the distribution of a magnetic field (a residual magnetic field) generated by the z main coil 9z with respect to the circumferential direction ($\theta$ direction) is substantially uniform. In this annular region, the z shield coil 10z is arranged. The z shield coil 10z can be easily formed by a coil substantially in a solenoid form because the z shield coil 10z is only required to reduce (shield) a magnetic field (a residual magnetic field) whose distribution with respect to the circumferential direction ($\theta$ direction) is substantially uniform. That is, it is possible to form the z shield coil 10z in a solenoid coil shape with a cross-section substantially in a circular shape, by adjusting the serpentine degrees and the numbers of wiring patterns 17a and wiring patterns 17b in the narrow region A2 (nearly $\theta=\pi/2$) and the wide regions A1 (nearly $\theta=0, \pi$), corresponding to the magnitude of the gap between the z main coil 9z and the z shield coil 10z. For example, although the numbers of turns of the wiring patterns 17a and the wiring patterns 17b were respectively three in FIG. 1A, arrangement can be made such that, the larger is the difference between the maximum gap and the minimum gap, the gap being between the z main coil 9z and the z shield coil 10z (the difference between the gaps in the narrow region A2 (nearly $\theta=\pi/2$) and in the wide regions A1 (nearly $\theta=0, \pi$), the larger is the number of serpentine turns. According to the first embodiment, as neither the z main coil 9z nor the z shield coil 10z includes a loop coil, arrangement of crossover lines connecting wiring patterns can be minimized. Thus, it is possible to reduce unnecessary eddy currents generated in peripheral structures, and attain easy manufacturing.

Connection wires, such as crossover lines, for connecting wiring patterns will be described later. First, for comparison with the first embodiment, connection wires, such as crossover lines, for connecting wiring patterns 15, 16 neighboring each other will be described regarding the z shield coil in Comparison Example 2 shown in FIG. 9B.

Figure 10A:
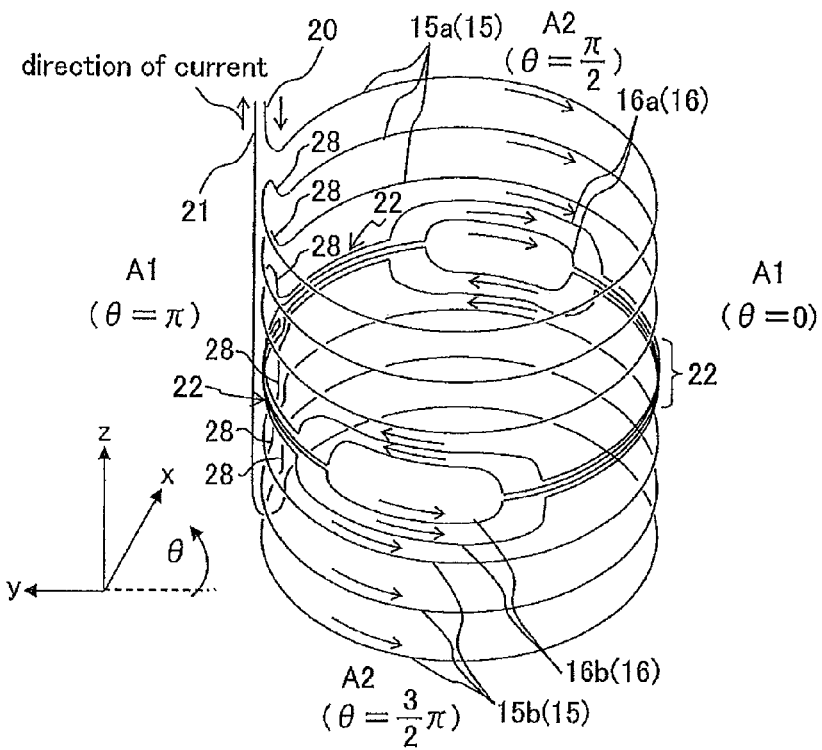
FIG. 10A is a perspective view (No. 1: dividing a loop coil by positive and negative of z coordinate) with transparency for showing the z shield coil of the gradient magnetic field coil of Comparison Example 2.

FIG. 10A is a perspective view with transparency for showing the z shield coil in Comparison Example 2. In FIG. 10A, loop coils of the wiring patterns 16 (16a, 16b) are divided from each other by the positive and negative of the z coordinate (on the zero plane F0 (z=0). The z shield coil in Comparison Example 2 is connected with outside by connection wires 20, 21, in the wide region A1 (nearly θ=π). A current flows in from the connection wire 20 and flows out from the connection wire 21. The current having flowed in from the connection wire 20 first flows in the wiring patterns 15a (15). The plural wiring patterns 15a (15) are mutually connected by crossover lines 28. After flowing in the wiring patterns 15a (15), the current flows in the wiring patterns 16a (16), which are on the upper side of the loop coil, through wires (connection wires) 22 which are substantially parallel to the wiring patterns 15a (15). Then, the direction of the current turns from the negative direction with respect to θ direction to the positive direction, and the current flows in the wiring patterns 16b (16) on the lower side of the loop coil. Then, the current flows in the wires 22 and flows into the wiring patterns 15b (15). The plural wiring patterns 15b (15) are mutually connected by crossover lines 28. The wiring patterns 15b (15) are connected to the connection wire 21, and the current flows out from a wiring pattern 15b (15) into the connection wire 21.

As shown in FIG. 10A, the wires 22 are disposed in the number of four and adjacent to each other. As the direction of current in two wires is opposite to the direction of current in the other two wires, almost no magnetic field is generated by these. However, as the wires are distant from each other with a gap by the width of a conductor, a slight magnetic field is generated. This slight magnetic field can be neglected, when compared with the magnetic field (gradient magnetic field) generated in the image capturing region 7, but cannot be neglected for the magnetic field (residual magnetic field) in the region, which is outside the z shield coil 10z with respect to the radial direction, where magnetic fields are originally shielded. Accordingly, the effects of eddy currents on peripheral structures caused by this magnetic field become significant to an extent which cannot be neglected, compared with a case that connection between turns is not considered.

Figure 10B:
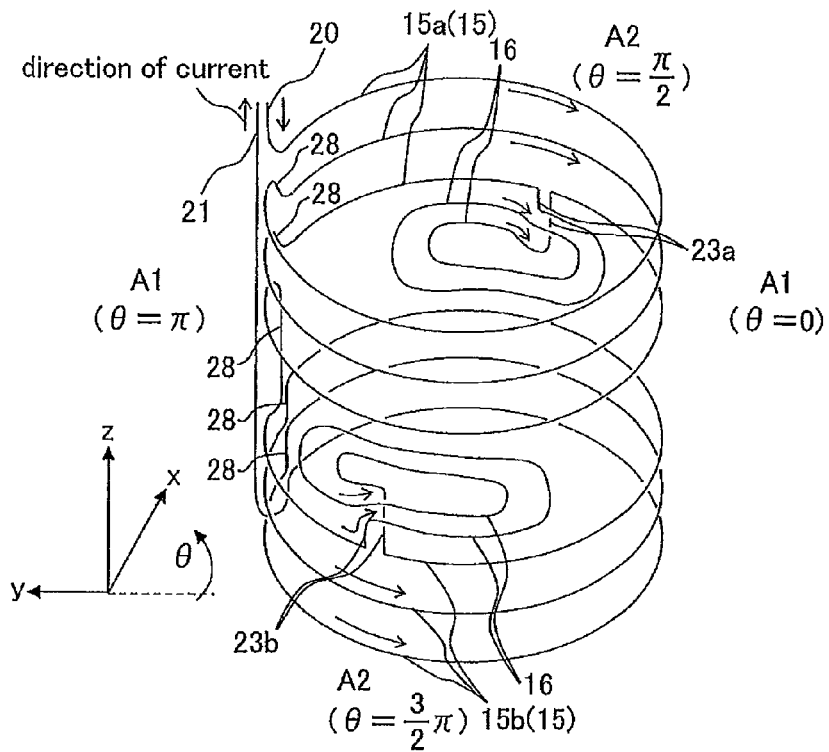
FIG. 10B is a perspective view (No. 2: connecting the loop coil with a solenoid coil) with transparency for showing the z shield coil of the gradient magnetic field coil of Comparison Example 2.

FIG. 10B also shows a perspective view with transparency for showing the z shield coil in Comparison Example 2. In FIG. 10B, each of the loop coils of the wiring patterns 16 is connected to the neighboring wiring pattern 15 (15a, 15b), through a connection wiring line 23a, 23b, at a position where they are the closest to each other. The z shield coil shown in FIG. 10B is also connected with outside by connection lines 20, 21 in the wide region A1 (nearly θ=π). Current flows in from the connection wire 20, and the current flows out from the connection wire 21. The current having flowed in from the connection wire 20 first flows in the wiring patterns 15a (15). The plural wiring patterns 15a (15) are mutually connected by crossover lines 28. In mid-flow in the wiring pattern 15a (15) adjacent to the loop coil of the wiring pattern 16, the current flows in the wiring pattern 16 of the loop coil through the connection wire 23a, which is substantially perpendicular to the wiring pattern 15a (15), and then returns to the wiring pattern 15a (15). Then, after flowing in the wiring pattern 15a (15), the direction of the current turns from the negative direction to the positive direction with respect to θ direction, and the current flows in the wiring patterns 15b (15). In mid-flow in the wiring pattern 15b (15) adjacent to the loop coil of the wiring pattern 16, the current flows in the wiring pattern 16 of the loop coil through the connection wire 23b, which is substantially perpendicular to the wiring pattern 15b (15), and then returns to the wiring pattern 15b (15). The current flows in the wiring patterns 15b (15). The plural wiring patterns 15b (15) are mutually connected by crossover lines 28. A wiring pattern 15b (15) is connected to the connection wire 21, and the current flows out from the wiring pattern 15b (15) to the connection wire 21.

As shown in FIG. 10B, the effects of eddy currents can be reduced to the minimum because the connection wires 23a, 23b can be made short, however, when the number of turns of the wiring patterns 16 for s loop coil become equal to or greater than two (double), one of the two connection wires 23a and one of the two connection wires 23b intersect with a wiring pattern 16 for the loop coil. This intersection occurs in the narrow regions A2 (nearly θ=π/2, 3π/2), where the gap between the z main coil 9z and the z shield coil 10z becomes the narrowest, and a space margin for intersecting wires is not available as long as it is formed in a single spire, using one coil wire.

Regarding the z main coil 9z in the first embodiment shown in FIG. 1A, connection wires, such as crossover lines, for connection between the wiring patterns 17 (17a, 17b) and the wiring patterns 18 (18a, 18b) neighboring each other will be described below.

FIG. 11A is a perspective view with transparency for showing the z main coil (the first coil) 9z of the gradient magnetic field coil according to the first embodiment of the present invention. The z main coil 9z in the first embodiment is connected with outside by the connection wires 24, 25 in the wide region A1 (nearly π=0). A current flows in from the connection wire 24 and flows out from the connection wire 25. The current having flowed in from the connection wire 24 first flows in the wiring patterns 18b. The plural wiring patterns 18b are mutually connected by crossover lines 28. Having flowed in the wiring patterns 18b, the current flows in the serpentine wiring patterns 17b through the crossover line 28. Then, the current flows in a crossover line 28, turns from the negative direction to the positive direction with respect to θ direction, and flows in the serpentine wiring patterns 17a. Then, the current flows in a crossover line 28 and flows into the wiring patterns 18a. The plural wiring patterns 18a are mutually connected by crossover lines 28. A wiring pattern 18a is connected to the connection wire 25, and the current flows out from the wiring pattern 18a to the connection wire 25.

As shown in FIG. 11A, all crossover lines 28 can be provided in the wide region A1 (nearly θ=π), to be substantially parallel to each other and adjacent to the connection wire 24. As the current flowing in the crossover lines 28 is substantially in the positive direction with respect to the z-axis direction, that is, in the direction opposite to the direction of the current flowing in the connection wire 24, almost no magnetic field is generated by these currents. Further, the connection wire 24 intersect with the wiring patterns 17a, 17b, 18a, 18b and the crossover lines 28, however, these intersections occur in the wide region A1 (nearly θ=π), where the gap between the z main coil 9z and the z shield coil 10z is the widest. Accordingly, it is easy to endure a space margin for intersection between wires.

Regarding the z shield coil 10z in the first embodiment shown in FIG. 1B, connection wires, such as crossover lines, for connection between wiring patterns 19 neighboring each other will be described below.

FIG. 11B is a perspective view with transparency for showing the z shield coil (the second coil) 10z of the gradient magnetic field coil according to the first embodiment of the present invention. The z shield coil 10z in the first embodiment is connected with outside by the connection wires 26, 27 in the wide region A1 (nearly θ=π). A current flows in from the connection wire 26 and flows out from the connection wire 27. The current having flowed in from the connection wire 26 first flows in the wiring patterns 19a (19). The plural wiring patterns 19a are mutually connected by crossover lines 28. Having flowed in the wiring patterns 19a (19), the current flows in the crossover lines 28, turns from the negative direction to the positive direction with respect to θ direction, and flows in the wiring patterns 19b (19). The plural wiring patterns 19b (19) are mutually connected by crossover lines 28. A wiring pattern 19b (19) is connected to the connection wire 27, and the current flows out from the wiring pattern 19b to the connection wire 27.

As shown in FIG. 11B, all crossover lines 28 can be provided in the wide region A1 (nearly θ=π), to be substantially parallel to each other and adjacent to the connection wire 27. As the current flowing in the crossover lines 28 is substantially in the negative direction with respect to z-axis direction, that is, in the direction opposite to the direction of the current flowing in the connection wire 27, almost no magnetic field is thereby generated. Further, the connection wire 27 intersect with the wiring patterns 19 (19a, 19b) and the crossover lines 28, however, these intersections occur in the wide region A1 (nearly θ=π), where the gap between the z main coil 9z and the z shield coil 10z is the widest. Accordingly, it is easy to endure a space margin for intersection between wires.

As described above, according to the first embodiment, a loop coil, through which z axis does not penetrate, is not formed for neither the z main coil 9z nor the z shield coil 10z, which makes it possible to minimize the distance of arranging connection wires for connecting the turns. Thus, it is possible to reduce unnecessary eddy currents generated in peripheral structures, and attain easy manufacturing.

By arranging the gradient magnetic field shield coil 2b (10x, 10y, 10z) as described in the present embodiment, it is possible to reduce leakage of pulse form magnetic fields generated by the gradient magnetic field main coils 2a (9x, 9y, 9z) to outside, and to reduce generation of eddy currents in the housing (the helium container, the radiation shield, the vacuum housing) that cover the static-magnetic-field coil device 1, and attain a desired gradient magnetic field distribution. Further, by arranging the gradient magnetic field shield coil 2b between the gradient magnetic field main coils and the static-magnetic-field coil device 1, it is possible to reduce vibration of the static-magnetic-field coil 1 caused by a current flowing in the static-magnetic-field coil 1 and a vibration electromagnetic force generated in a magnetic field leaking from the gradient magnetic field main coil 2a, and prevent temporal variation in a uniform magnetic field that is generated in the image capturing region.

Second Embodiment

Figure 12A:
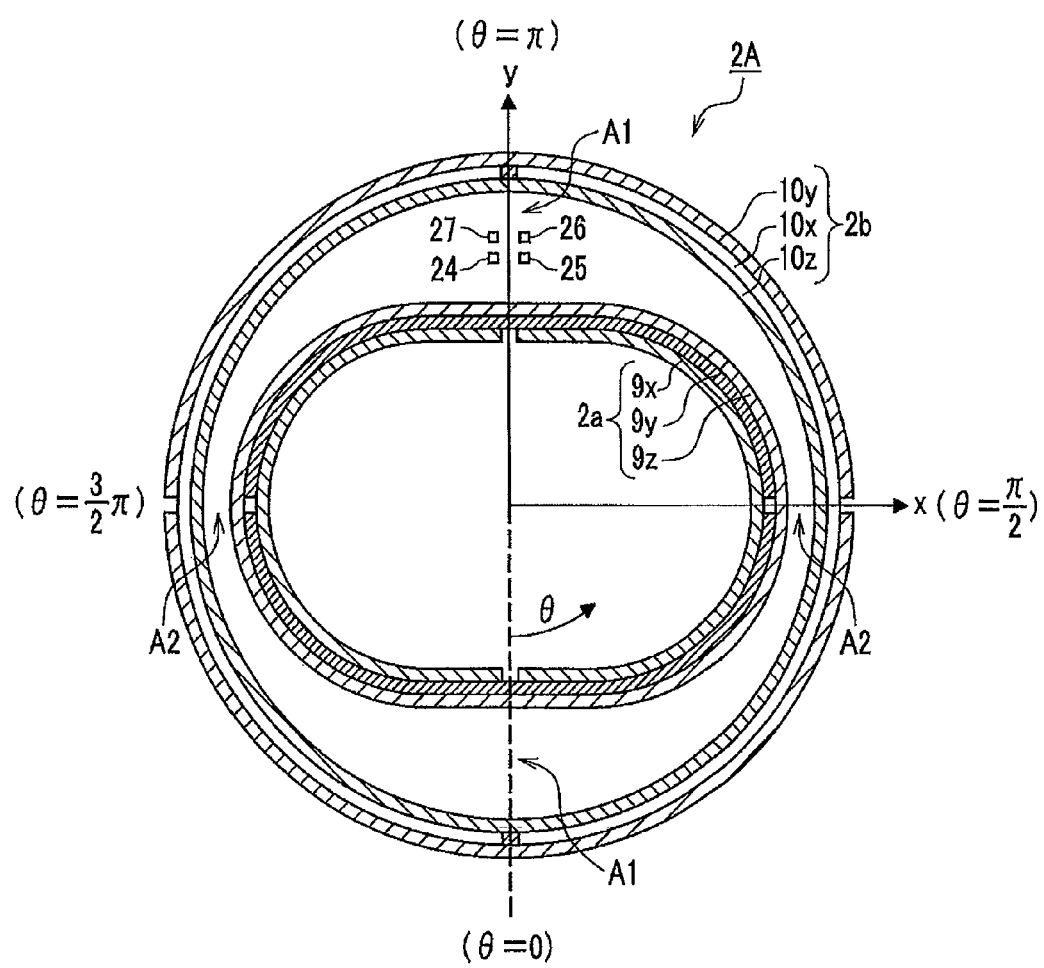
FIG. 12A is a cross-sectional view of a gradient magnetic field coil according to a second embodiment of the present invention, obtained by cutting the coil with a plane including the x-axis and the y-axis.

FIG. 12A is a cross-sectional view of a gradient magnetic field coil 2A according to a second embodiment of the present invention, obtained by cutting the coil with a plane including the x-axis and the y-axis. The difference of the gradient magnetic field coil 2A in the second embodiment from the gradient magnetic field coil 2 in the first embodiment is that the cross-sectional shape of main coil 2a, particularly, that of the z main coil 9z is in a racetrack shape. Similarly to the first embodiment, the width of the cross-sectional shape of the z main coil 9z is at the maximum, with respect to the x-axis direction (horizontal direction). Therefore, in laying down a subject 40 (refer to FIG. 2) on the back thereof, as it is possible to insert the subject with a space margin in the shoulder width direction, a sense of openness that the subject 40 has with the MRI device 100 (refer to FIG. 2) can be improved. The central axis of the (gradient magnetic field) main coil 2a and the central axis of the shield coil 2b are along the z-axis direction and agree with each other. A first region (wide region) A1 is formed, extending from the short axis of the racetrack shape of the (gradient magnetic field) main coil 2a, and a second region (narrow region) A2 is formed, extending from the long axis of the racetrack shape of the (gradient magnetic field) main coil 2a. Further, similarly to the first embodiment, the gap between the z main coil 9z and the z shield coil 10z changes with the circumferential direction (θ direction), and the gap between the z main coils 9z and the z shield coils 10z is smaller on the x-axis (θ=π/2, 3π/2 (in the narrow regions A2)) than on the y-axis (θ=0, π (the wide regions A1)).

Figure 12B:
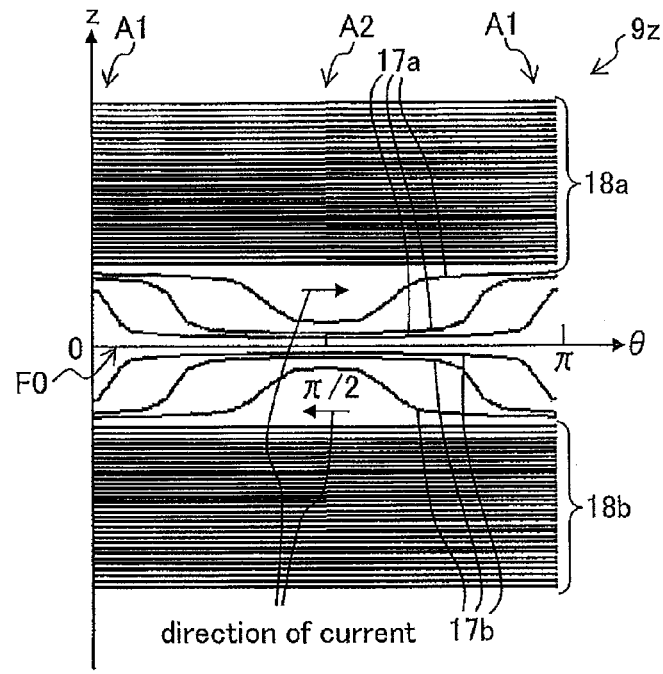
FIG. 12B shows a half of a development view of the wiring patterns of the z main coil (the first coil) of the gradient magnetic field coil according to the second embodiment of the present invention.

FIG. 12B shows a half of a development view of the wiring patterns 17a, 17b. 18a. 18b of the z main coil (first coil) 9z of the gradient magnetic field coil 2A according to the second embodiment of the present invention. Similarly to the first embodiment, also in the second embodiment, formed are wiring patterns 17a, 17b substantially in a solenoid form such that, in the wide regions A1 (nearly θ=0, π), the wiring patterns 17a, 17b approach the outer wiring patterns 18a, 18b substantially in a solenoid coil shape, and in the narrow region A2 (nearly θ=π/2), the wiring patterns 17a, 17b are formed substantially in a solenoid form that is serpentine in the z-axis direction as going closer to the zero plane F0 (z=0 plane) and going in the θ direction around z-axis.

Figure 12C:
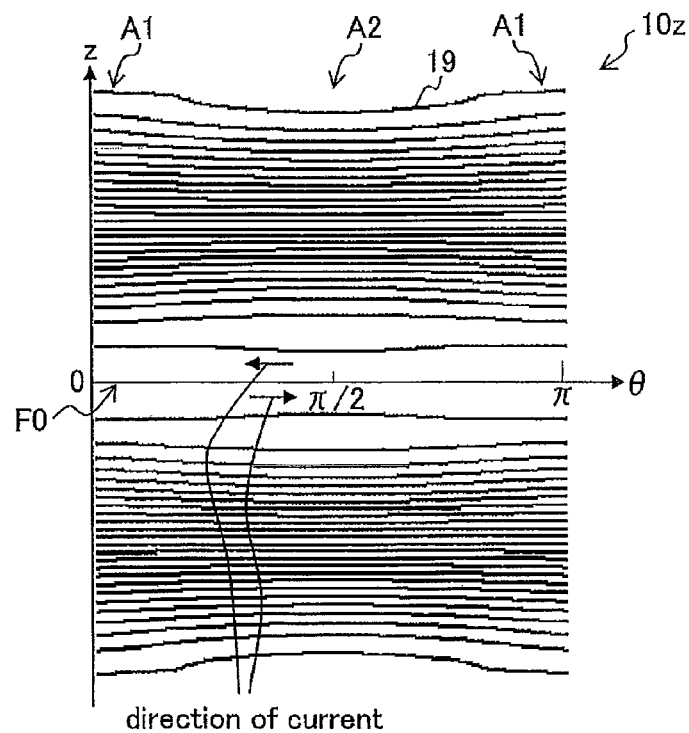
FIG. 12C shows a half of a development view of the wiring patterns of the z shield coil (the second coil) of the gradient magnetic field coil according to the second embodiment of the present invention.

FIG. 12C shows a half of a development view of the wiring patterns 19 of the z shield coil (the second coil) 10z of the gradient magnetic field coil 2A according to the second embodiment of the present invention. Similarly to the first embodiment, in the second embodiment also, the z shield coil 10z forms wiring patterns 19 substantially in a solenoid form, without including a loop coil which z-axis does not penetrate through.

Similarly to the first embodiment, according to the second embodiment, as a loop coil is not formed neither for the z main coil 9z nor the z shield coil 10z, the arrangement of connection wires for connecting turns can be minimized, and it is thereby possible to reduce eddy currents generated in peripheral structures, and attain easy manufacturing.

Third Embodiment

Figure 13A:
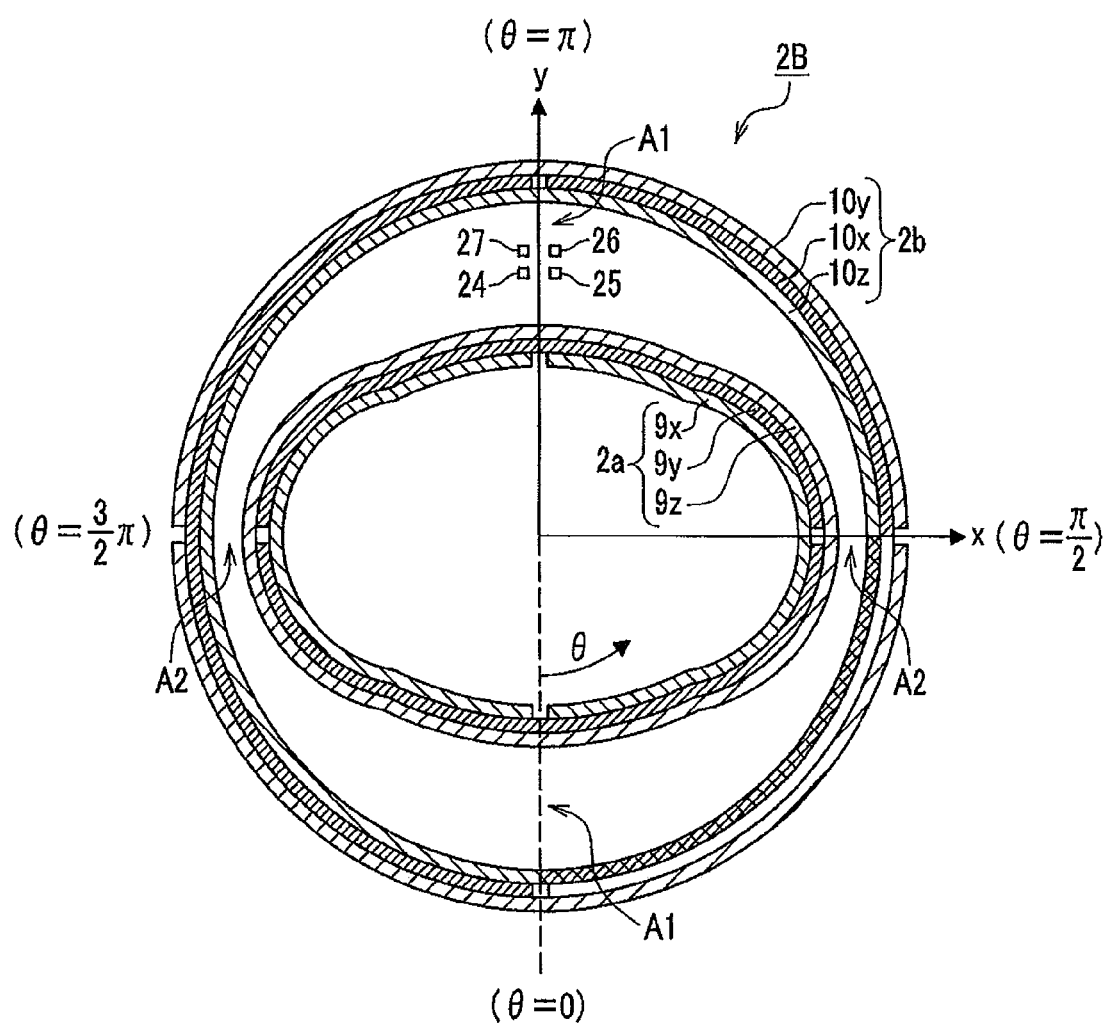
FIG. 13A is a cross-sectional view of a gradient magnetic field coil according to a third embodiment of the present invention, obtained by cutting the coil with a plane including the x-axis and the y-axis.

FIG. 13A is a cross-sectional view of a gradient magnetic field coil 2B according to a third embodiment of the present invention, obtained by cutting the coil with a plane including x-axis and y-axis. The gradient magnetic field coil 2B in the third embodiment is different from the gradient magnetic field coil 2 in the first embodiment, in the following point. That is, regarding the cross-sectional shape of the main coil 2a, particularly the cross-sectional shape of the z main coil 9z, the arc portions in the peripheries where the short axis passes through are formed to be an ellipse shape, and the arc portions in the peripheries where the long axis of the ellipse shape passes through are formed to be an arc with a different curvature such that the ellipse shape is expanded along the y-axis direction, and accordingly the cross-section is in a shape formed by a combination of plural arcs with different curvatures. That is, the cross-section obtained by cutting the (gradient magnetic field) main coil 2a by a plane perpendicular to the axis direction is formed based on an ellipse shape such that the arc portions in the peripheries at the respective ends of the long axis of the ellipse are expanded along the short axis direction of the ellipse. The central axis of the (gradient magnetic field) main coil 2a and the central axis of the (gradient magnetic field) shield coil 2b are along the z-axis direction and agree with each other. A first region (wide region) A1 is formed, extending from the short axis of the ellipse shape of the (gradient magnetic field) main coil 2a, and a second region (narrow region) A2 is formed, extending from the long axis of the ellipse shape of the (gradient magnetic field) main coil 2a. Similarly to the first embodiment, the width of the cross-sectional shape of the z main coil 9z is at the maximum in the x-axis direction (horizontal direction). Therefore, in laying down a subject 40 (refer to FIG. 2) on the back thereof, as it is possible to insert the subject with a space margin in the shoulder width direction, a sense of openness that the subject 40 has with the MRI device 100 (refer to FIG. 2) can be improved. Further, similarly to the first embodiment, the gap between the z main coil 9z and the z shield coil 10z changes with the circumferential direction (θ direction), and the gap between the z main coil 9z and the z shield coil 10z is smaller on x-axis (θ=π/2, 3π/2 (in the narrow regions A2)) than on y-axis (θ=0, π (the wide regions A1)).

Figure 13B:
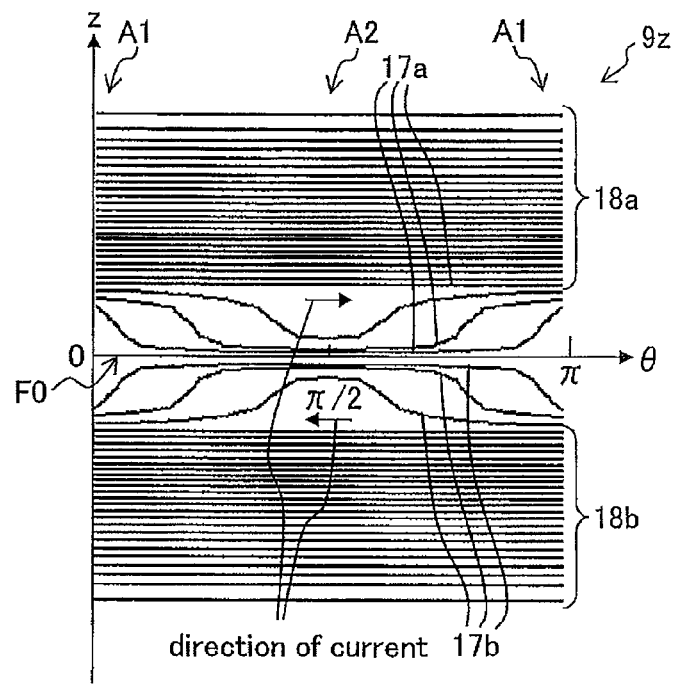
FIG. 13B shows a half of a development view of the wiring patterns of the z main coil (the first coil) of the gradient magnetic field coil according to the third embodiment of the present invention.

FIG. 13B shows a half of a development view of the wiring patterns of 17a, 17b, 18a, 18b of the z main coil (the first coil) 9z of the gradient magnetic field coil 2B according to the third embodiment of the present invention. Similarly to the first embodiment, also in the third embodiment, formed are wiring patterns 17a, 17b substantially in a solenoid form such that, in the wide regions A1 (nearly θ=0, π), the wiring patterns 17a, 17b approach the outer wiring patterns 18a, 18b substantially in a solenoid coil form, and in the narrow region A2 (nearly θ=π/2), the wiring patterns 17a, 17b are formed substantially in a solenoid form that is serpentine in the z-axis direction as going closer to the zero plane F0 (z=0 plane) and going in the θ direction around z-axis.

Figure 13C:
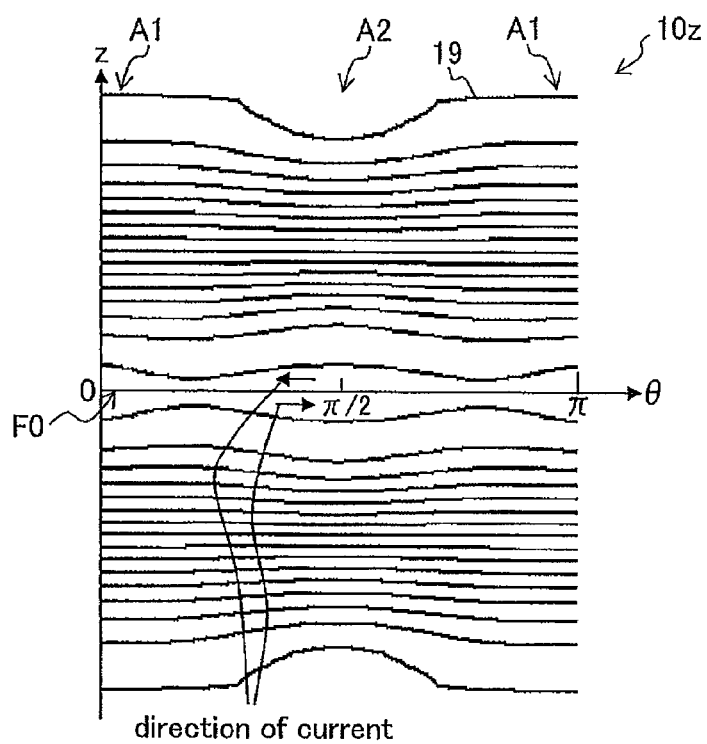
FIG. 13C shows a half of a development view of the wiring patterns of the z shield coil (the second coil) of the gradient magnetic field coil according to the third embodiment of the present invention.

FIG. 13C shows a half of a development view of the wiring patterns 19 of the z shield coil (the second coil) 10z of the gradient magnetic field coil 2B according to the third embodiment of the present invention. Similarly to the first embodiment, in the third embodiment also, the z shield coil 10z forms wiring patterns 19 substantially in a solenoid form, without including a loop coil which z-axis does not penetrate through.

Similarly to the first embodiment, according to the third embodiment, as a loop coil is not formed neither for the z main coil 9z nor the z shield coil 10z, the arrangement of connection wires for connecting turns can be minimized, and it is thereby possible to reduce eddy currents generated in peripheral structures, and attain easy manufacturing.

Fourth Embodiment

Figure 14A:
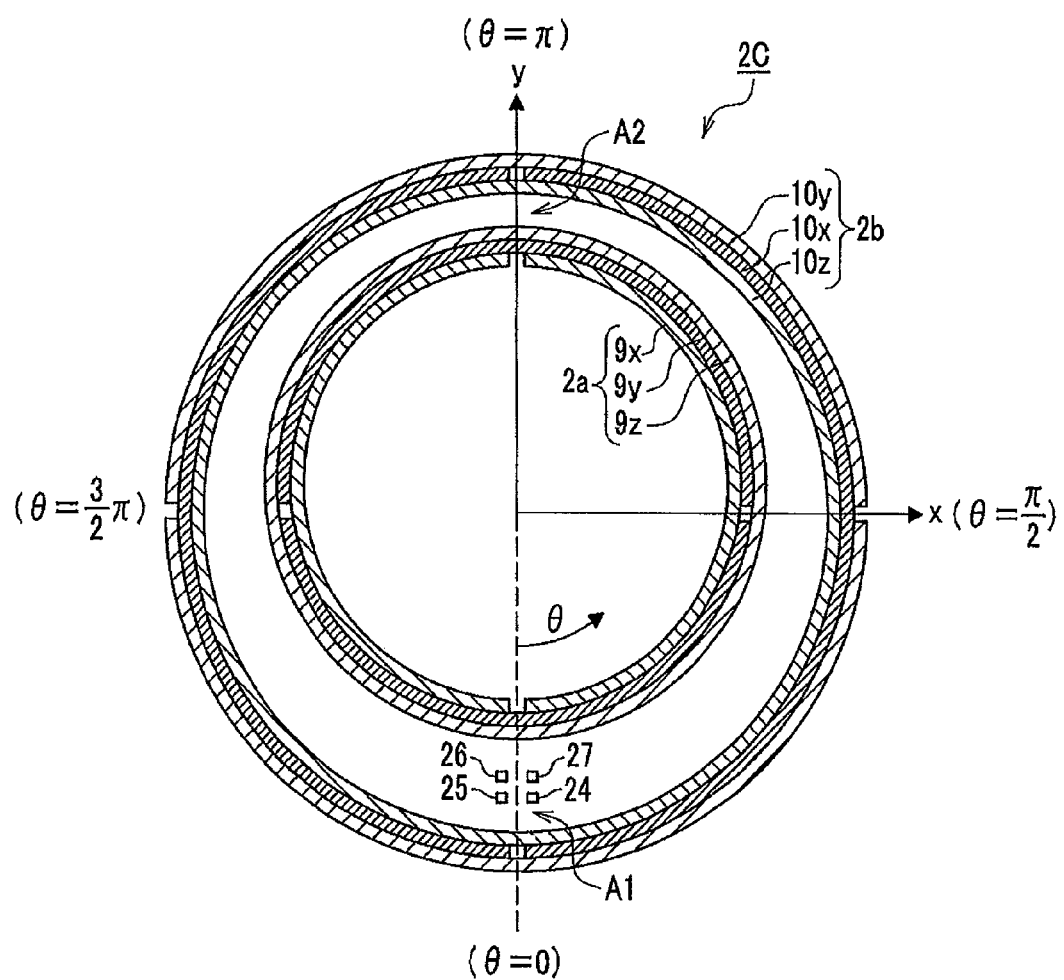
FIG. 14A is a cross-sectional view of a gradient magnetic field coil according to a fourth embodiment of the present invention, obtained by cutting the coil with a plane including the x-axis and the y-axis.

FIG. 14A is a cross-sectional view of a gradient magnetic field coil 2C according to a fourth embodiment of the present invention, obtained by cutting the coil with a plane including x-axis and y-axis. The gradient magnetic field coil 2C in the fourth embodiment is different from the gradient magnetic field coil 2 in the first embodiment, in the following point. That is, regarding the cross-sectional shape of the main coil 2a, particularly the cross-sectional shape of the z main coil 9z, the cross-section is in a circular shape, wherein the center of the circular shape of the z main coil 9z and the center of the circular shape of the z shield coil 10z do not agree with each other, in other words, the circles are not concentric circles such that the centers of the respective circular shapes are deviated from each other along the y axis direction (The center positions of the circulars are different.). Similarly to the first embodiment, the gap between the z main coil 9z and the z shield coil 10z changes with the circumferential direction (θ direction), wherein the gap between the z main coil 9z and the z shield coil 10z is narrower on y-axis (θ=π (the narrow region A2)) than on y-axis (θ=0 (the wide region A1)). That is, the first region (wide region) A1 is formed on one side with respect to the deviation between the central axis of the (gradient magnetic field) main coil 2a and the central axis of the (gradient magnetic field) shield coil 2b, and the second region (narrow region) A2 is formed on the other side opposite to the one side, the one and the other sides being on the direction of the deviation.

Figure 14B:
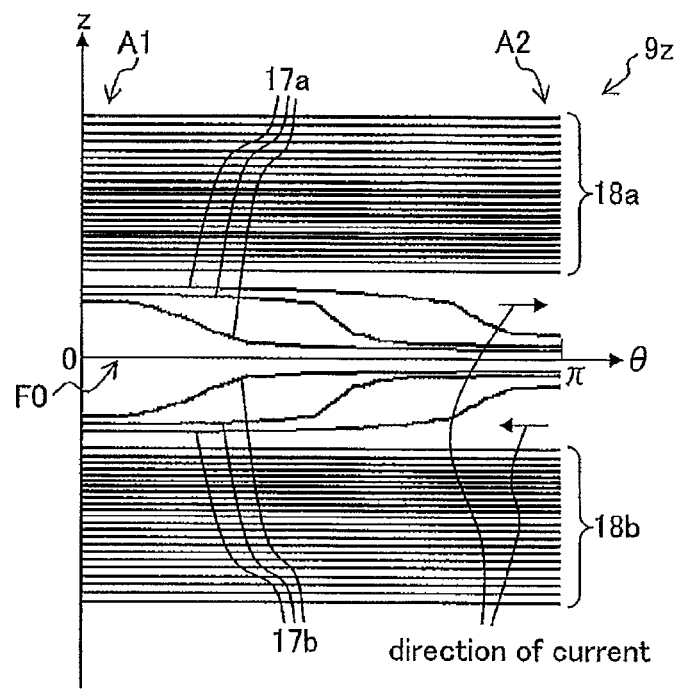
FIG. 14B shows a half of a development view of the wiring patterns of the z main coil (the first coil) of the gradient magnetic field coil according to the fourth embodiment of the present invention.

FIG. 14B shows a half of a development view of the wiring patterns 17a, 17b, 18a, 18b of the z main coil (the first coil) 9z of the gradient magnetic field coil 2C according to the fourth embodiment of the present invention. Similarly to the first embodiment, also in the fourth embodiment, formed are wiring patterns 17a, 17b substantially in a solenoid form such that, in the wide region A1 (nearly θ=0), the wiring patterns 17a, 17b approach the outer wiring patterns 18a, 18b substantially in a solenoid coil form, and in the narrow region A2 (nearly θ=π), the wiring patterns 17a, 17b are formed substantially in a solenoid form that is serpentine in the z-axis direction as going closer to the zero plane F0 (z=0 plane) and going in the θ direction around z-axis.

In the first to third embodiments, as the cross-sectional shape of the z main coil 9z is plane-symmetric with respect to y-z plane and x-z plane, a region (wide regions) A1, where the gap between the z main coil 9z and the z shield coil 10z is at the maximum, is present at two positions, namely, θ=0, θ=π, and in the respective wide regions A1, the serpentine wire patterns 17a, 17b approach the wiring patterns 18a, 18b substantially in a solenoid form. In the fourth embodiment, a region (wide region) A1, where the gap between the z main coil 9z and the z shield coil 10z is at the maximum, is present at one position, namely, θ=0, and accordingly the serpentine wiring patterns 17a, 17b approach the wiring patterns 18a, 18b substantially in a solenoid form, at only one position, namely, in this wide region A1.

Figure 14C:
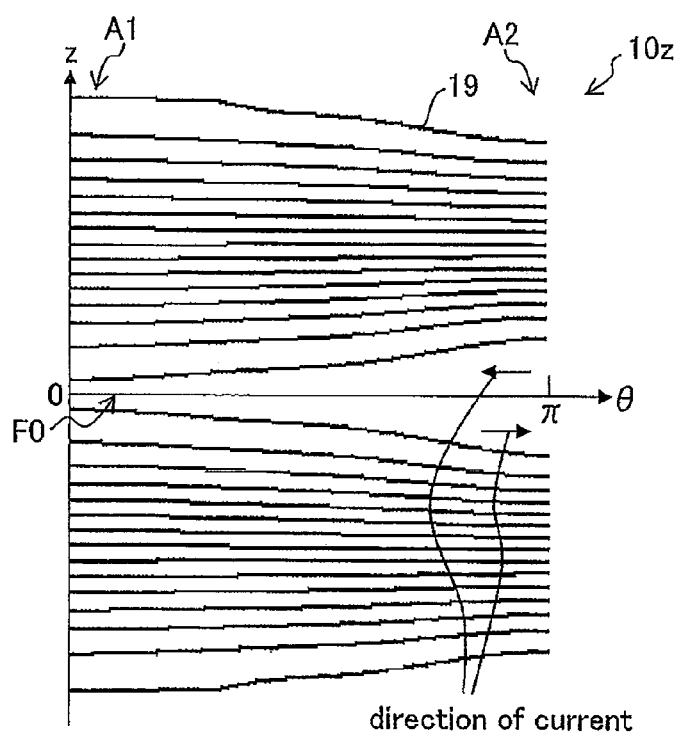
FIG. 14C shows a half of a development view of the wiring patterns of the z shield coil (the second coil) of the gradient magnetic field coil according to the fourth embodiment of the present invention.

FIG. 14C shows a half of a development view of the wiring patterns 19 of the z shield coil (the second coil) 10z of the gradient magnetic field coil 2C according to the fourth embodiment of the present invention. Similarly to the first embodiment, in the fourth embodiment also, the z shield coil 10z forms wiring patterns 19 substantially in a solenoid form, without including a loop coil which z-axis does not penetrate through.

Similarly to the first embodiment, according to the fourth embodiment, as a loop coil is not formed neither for the z main coil 9z nor the z shield coil 10z, the arrangement of connection wires for connecting turns can be minimized, and it is thereby possible to reduce eddy currents generated in peripheral structures, and attain easy manufacturing.

Fifth Embodiment

Figure 15A:
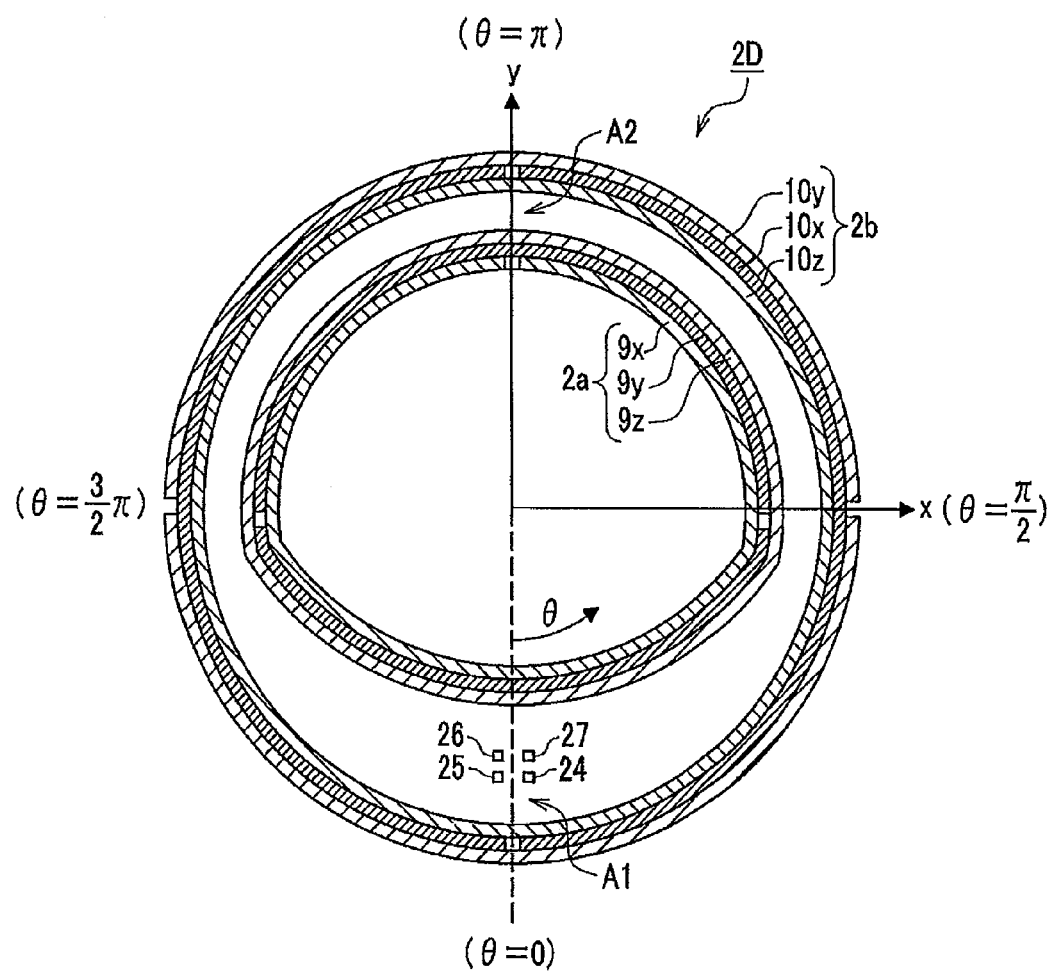
FIG. 15A is a cross-sectional view of a gradient magnetic field coil according to a fifth embodiment of the present invention, obtained by cutting the coil with a plane including the x-axis and the y-axis.

FIG. 15A is a cross-sectional view of a gradient magnetic field coil 2D according to a fifth embodiment of the present invention, obtained by cutting the coil with a plane including x-axis and y-axis. The gradient magnetic field coil 2D in the fifth embodiment is different from the gradient magnetic field coil 2 in the first embodiment, in the following point. That is, regarding the cross-sectional shape of the main coil 2a, particularly the cross-sectional shape of the z main coil 9z, the cross-section is formed by combination of arcs having different curvatures depending on whether the arc is in the upper portion or in the lower portion. The radius (curvature) of the arc in the lower portion is made greater than that of the arc in the upper portion. Further, the open area in the positive region with respect to y-axis is made larger than that on the negative region. That is, regarding the cross-sectional shape cut by a plane perpendicular to the axis direction of the (gradient magnetic field) main coil 2a, based on a circular shape, the circular arc portion substantially in the lower portion of the circular shape is made an arc with a radius that is larger than that of the radius of the circular shape. The center of the circular shape, as the base of the cross-sectional shape of the (gradient magnetic field) main coil 2a, and the center of the cross-sectional shape of the (gradient magnetic field) shield coil 2b agree with each other. A second region (narrow region) A2 is formed on the side of the circular shape which is the base of the (gradient magnetic field) main coil 2a, and a first region (wide region) A1 is formed on the side of the arc with a radius larger than that of the circular shape which the base of the (gradient magnetic field) main coil 2a. Thus, in laying down a subject 40 on the back thereof, it is possible to fit the arc in the lower portion to the back of the subject 40, and ensure a sufficient space on the front side of the face of the subject 40. Further, similarly to the first embodiment, the gap between the z main coil 9z and the z shield coil 10z changes with the circumferential direction (θ direction), wherein the gap between the z main coil 9z and the z shield coil 10z is narrower on y-axis (θ=π (the narrow region A2)) than on y-axis (θ=0 (the wide region A1)).

Figure 15B:
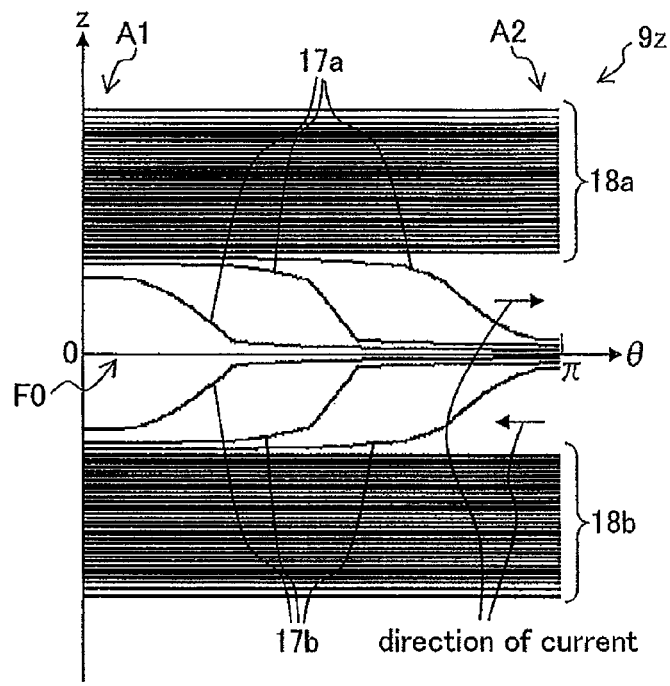
FIG. 15B shows a half of a development view of the wiring patterns of the z main coil (the first coil) of the gradient magnetic field coil according to the fifth embodiment of the present invention.

FIG. 15B shows a half of a development view of the wiring patterns 17a, 17b, 19a, 18b of the z main coil (the first coil) 9z of the gradient magnetic field coil 2D according to the fifth embodiment of the present invention. Similarly to the first embodiment, also in the fifth embodiment, formed are wiring patterns 17a, 17b substantially in a solenoid form such that, in the wide region A1 (nearly θ=0), the wiring patterns 17a, 17b approach the outer wiring patterns 18a, 18b substantially in a solenoid coil form, and in the narrow region A2 (nearly θ=π), the wiring patterns 17a, 17b are formed substantially in a solenoid coil form that is serpentine in the z-axis direction as going closer to the zero plane F0 (z=0 plane) and going in the θ direction around z-axis.

Similarly to the fourth embodiment, in the fifth embodiment, an region (wide region) A1, where the gap between the z main coil 9z and the z shield coil 10z is at the maximum, is present at one position, namely, the position where θ=0, and accordingly the serpentine wiring patterns 17a, 17b approach the wiring patterns 18a, 18b substantially in a solenoid form, at only one position, namely, in this wide region A1.

Figure 15C:
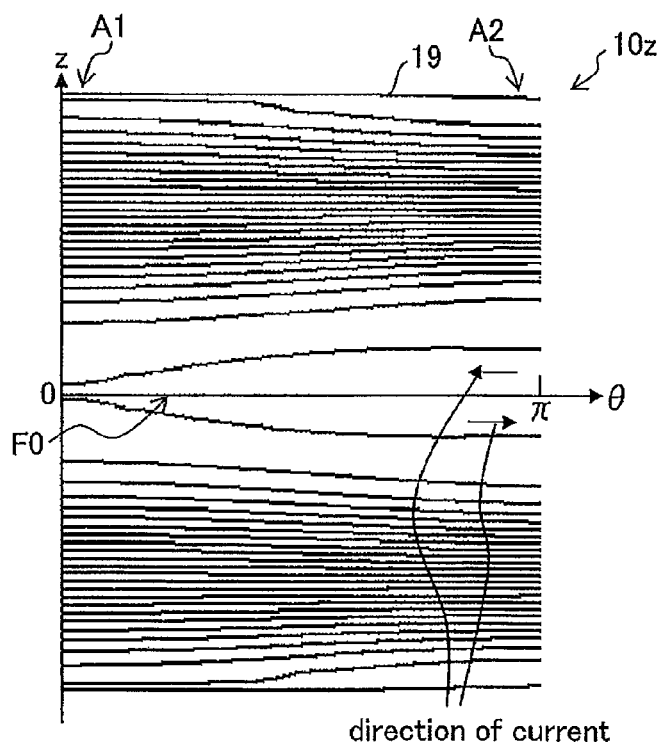
FIG. 15C shows a half of a development view of the wiring patterns of the z shield coil (the second coil) of the gradient magnetic field coil according to the fifth embodiment of the present invention.

FIG. 15C shows a half of a development view of the wiring patterns 19 of the z shield coil (second coil) 10z of the gradient magnetic field coil 2D according to the fifth embodiment of the present invention. Similarly to the first embodiment, in the fifth embodiment also, the z shield coil 10z forms wiring patterns 19 substantially in a solenoid form, without including a loop coil which z-axis does not penetrate through.

Similarly to the first embodiment, according to the fifth embodiment, as a loop coil is not formed neither for the z main coil 9z nor the z shield coil 10z, the arrangement of connection wires for connecting turns can be minimized, and it is thereby possible to reduce eddy currents generated in peripheral structures, and attain easy manufacturing.

Sixth Embodiment

A horizontal magnetic field MRI device in another embodiment of the present invention will be described below, with reference to FIGS. 16A, 16B, 17, 18A, 18B, 19A, and 19B.

Figure 17:
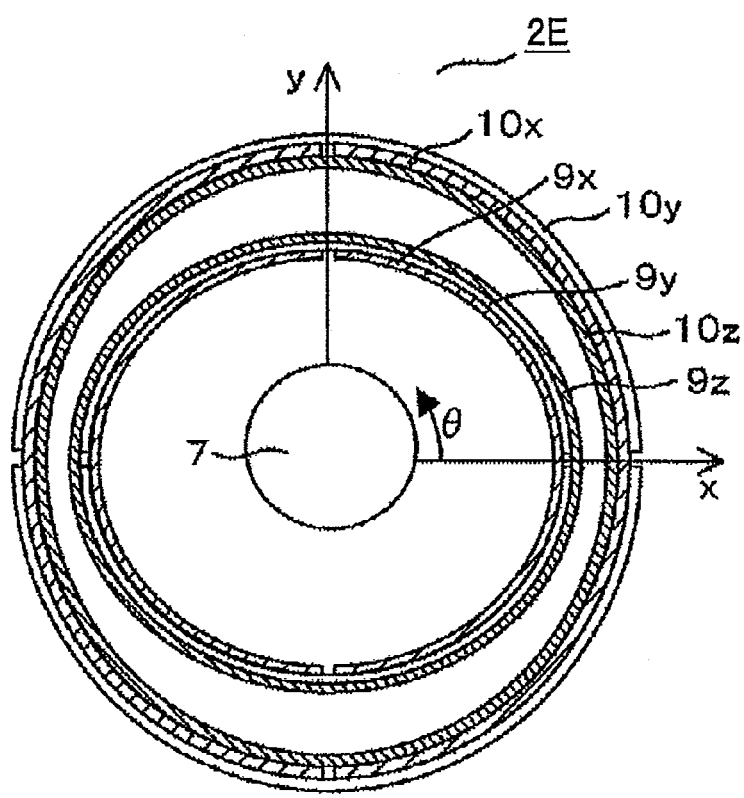
FIG. 17 is a cross-sectional view of the gradient magnetic field coil according to the sixth embodiment of the present invention, obtained by cutting the coil with a plane including the x-axis and the y-axis.
Figure 18A:
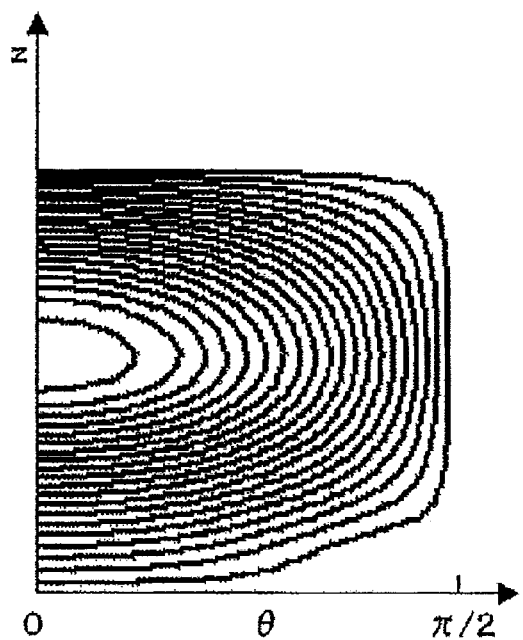
FIG. 18A shows a half of a development view of the wiring patterns of the x main coil of the gradient magnetic field coil according to the sixth embodiment of the present invention.
Figure 18B:
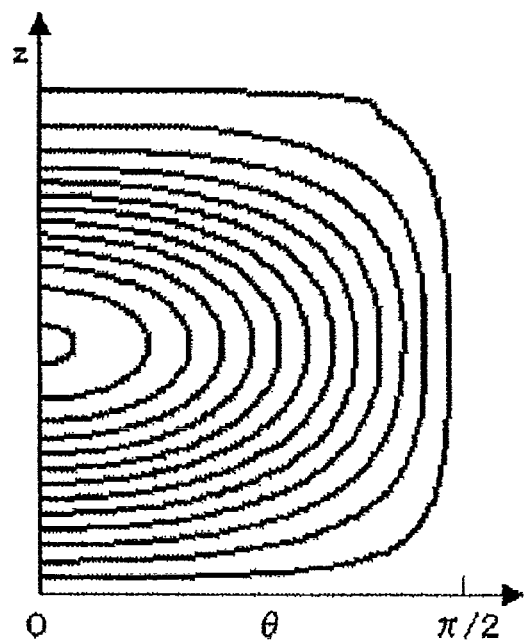
FIG. 18B shows a half of a development view of the wiring patterns of the x shield coil of the gradient magnetic field coil according to the sixth embodiment of the present invention.
Figure 19A:
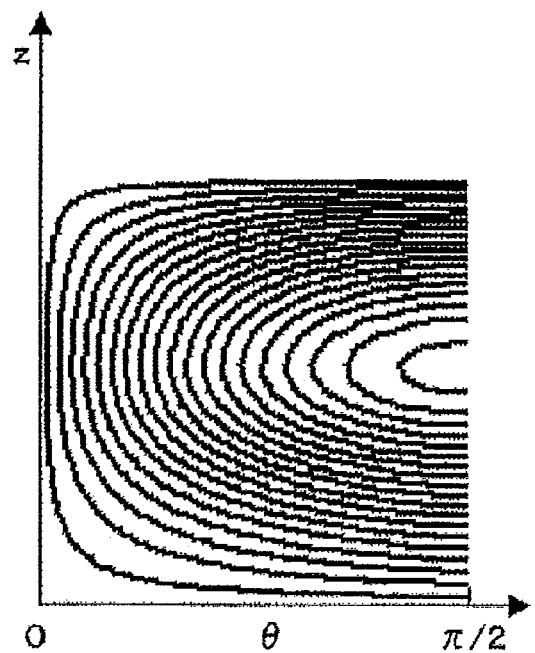
FIG. 19A shows a half of a development view of the wiring patterns of the y main coil of the gradient magnetic field coil according to the sixth embodiment of the present invention.
Figure 19B:
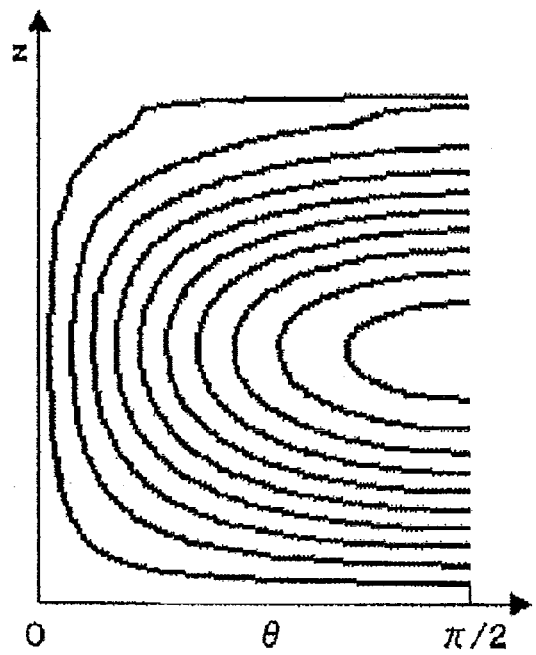
FIG. 19B shows a half of a development view of the wiring patterns of the y shield coil of the gradient magnetic field coil according to the sixth embodiment of the present invention.

The MRI device in the present embodiment has a structure where the gradient magnetic field coil 2 of the MRI device in the first embodiment is replaced by a gradient magnetic field coil 2E. The gradient magnetic field coil 2E in the present embodiment will be described below with reference to FIG. 17. FIG. 17 is a cross-sectional view of the gradient magnetic field coil 2E in the present embodiment, obtained by cutting the coil with a plane including x-axis and y-axis.

The gradient magnetic field coil 2E is arranged outside a vacuum housing 6 and at a position that is closer to an image capturing region 7 than the vacuum housing 6 is. The gradient magnetic field coil 2E includes gradient magnetic field main coils 9 (9x, 9y, 9z) and gradient magnetic field shield coils 10 (10x, 10y, 10z) in this order from the near side of the image capturing region 7. For the gradient magnetic field coil 2E described in the present embodiment, the cross-sectional shapes of the gradient magnetic field main coils 9 (9x, 9y, 9z) are elliptical while the cross-sectional shapes of the gradient magnetic field shield coils 10 (10x, 10y, 10z) are circular. The long axes of the gradient magnetic field main coils 9 (9x, 9y, 9z) are along the x-axis direction, and the short axes are along the y-axis direction. The gradient magnetic field coil 2E generates a gradient magnetic field that linearly varies in the x-axis direction, y-axis direction, and z-axis direction respectively with respect to the magnetic field component that is parallel to a static magnetic field 8. Concretely, the gradient magnetic field main coils 9 includes an x-gradient magnetic field main coil (x main coil) 9x that generates a gradient magnetic field along the x-axis direction, a y-gradient magnetic field main coil (y main coil) 9y that generates a gradient magnetic field along the y-axis direction, and a z-gradient magnetic field main coil (z main coil) 9z that generates a gradient magnetic field along the z-axis direction, which are laminated with insulation layers therebetween in the respective cross-sectional directions. The gradient magnetic field shield coils 10 include an x-gradient magnetic field shield coil (x shield coil) 10x, a y-gradient magnetic field shield coil (y shield coil) 10y, and a z-gradient magnetic field shield coil (z shield coil) 10z that reduce leakage of a magnetic field generated by the gradient magnetic field main coils 9, to the outside, which are laminated with insulation layers therebetween in the respective cross-sectional directions.

Each of the x main coil 9x and the x shield coil 10x, which are x-gradient magnetic field coils, is formed by four coils (whorled-saddle formed coils) with the shape of a whorled saddle arranged at positions which are symmetric with respect to the plane z=0 and the plane x=0 respectively. The y main coil 9y and the y shield coil 10y, which are y-gradient magnetic field coils, are different in shape from the x-gradient magnetic field coils, and are corresponding to rotation of the x-gradient magnetic field coils around the z axis by 90 degrees.

The wiring patterns of the gradient magnetic field coil 2E in the present embodiment will be described below with reference to FIGS. 16A, 16B, 18A, 18B, 19A, and 19B. Each of the x main coil 9x (FIG. 18A) and the x shield coil 10x (FIG. 18B), which are x-gradient magnetic field coils, is a coil (saddle-formed coil) with a shape of a whorled saddle. Further, each of the y main coil 9y (FIG. 19A) and the y shield coil 10y (FIG. 19B), which are y-gradient magnetic field coils, is also a coil (saddle-formed coil) with a shape of a whorled saddle. The wiring patterns of the x-gradient magnetic field coils and the y-gradient magnetic field coils are different in the number of turns from a case where the cross-sectional shapes of a gradient magnetic field main coil and a gradient magnetic field shield coil are circular, however, are substantially the same whorled-saddle-formed coils. Herein, connection sections for connecting respective current loops are not shown.

On the other hand, the wiring patterns of z-gradient magnetic field coils 10 in the present embodiment are significantly different from those of a conventional z main coil and a conventional z shield coil for which the cross-sectional shape of a gradient magnetic field coil is circular. In describing the difference, the difference of the gradient magnetic field coil in the present embodiment from those of comparative example (FIGS. 7, 8A, 8B) and comparative example 2 (FIGS. 9A and 9B) will be described below. In Comparative Example 1, as both the cross-sectional shapes of the z main coil and the z shield coil are circular, the magnetic field distributions generated by the wiring patterns 11 (FIG. 8A) of the z main coil and the wiring patterns 12 (FIG. 8B) of the z shield coil are uniform along the circumferential direction. These two kinds of wiring patterns in Comparative Example 1 have circular current flow paths, each of which is on a plane perpendicular to z axis, and form solenoid form coils with lamination of the circular current flow paths in the z direction. Connection sections for connecting circular current flow paths neighboring each other are not shown in FIG. 7, 8A, or 8B.

As Comparative Example 2, the wiring patterns of z-gradient magnetic field coils with a cross-sectional shape on x-y plane will be described below with reference to FIGS. 9A and 9B, in view of cross-sectional shapes. FIG. 9A shows a development view of the wiring patterns 13, 14 of the z main coil in Comparative Example 2, and FIG. 9B shows a development view of the wiring patterns 15, 16 of the z shield coil in Comparative Example 2. This is a case, as described in Patent Document 2, that there are a portion where the gap between a main coil and a shield coil is narrow and a portion where the gap between the main coil and the shield coil is wide, wherein the magnetic fields which the respective coils generate are strong on the x direction sides where the gap is narrow. Therefore, in Comparative Example 2, in order that the magnetic fields are reproduced, loop coils across the z=0 plane are formed, as the wiring pattern 14 for the z main coil, and as the wiring patterns 16 for the z shield coil. Other wiring patterns 13 of the z main coil and other wiring patterns 15 of the z shield coil form a coil substantially in a solenoid form that is serpentine around the z axis on a cylindrical surface or an elliptical surface. Connection sections for connecting circular current flow paths neighboring each other are not shown in FIG. 9A nor FIG. 9B, similarly to the case of FIG. 7, 8A, or 8B.

Figure 16A:
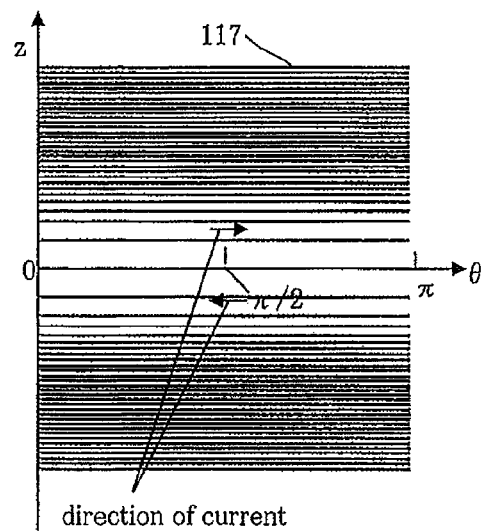
FIG. 16A shows a half of a development view of the wiring patterns of the z main coil of a gradient magnetic field coil according to a sixth embodiment of the present invention.
Figure 16B:
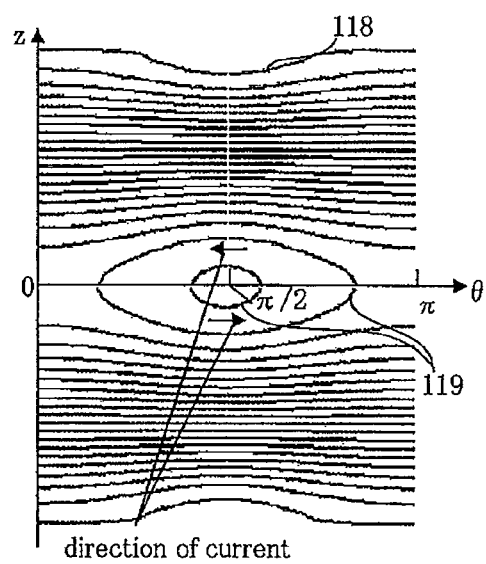
FIG. 16B shows a half of a development view of the wiring patterns of the z shield coil of the gradient magnetic field coil according to the sixth embodiment of the present invention.
Figure 21A:
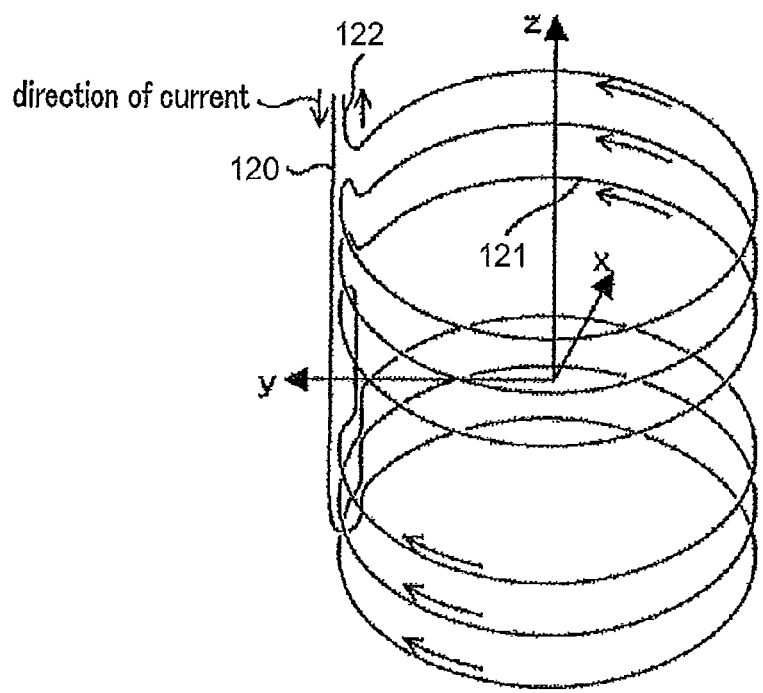
Figure 21B:
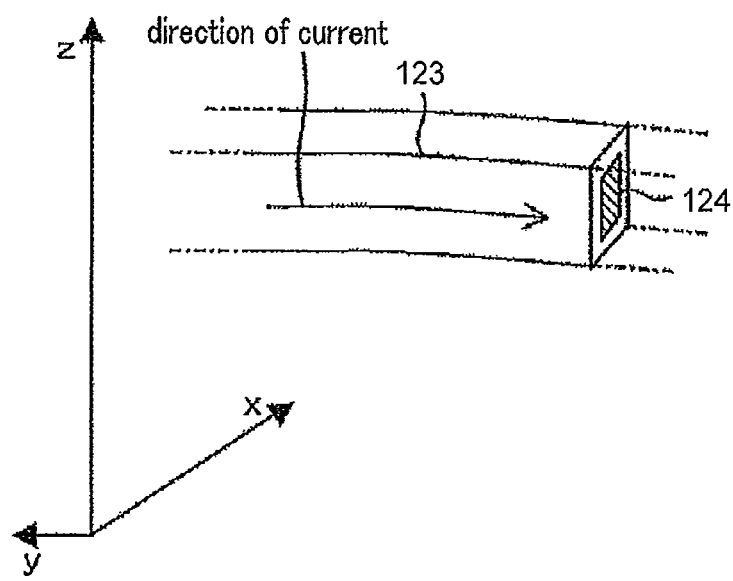
Figure 22A:
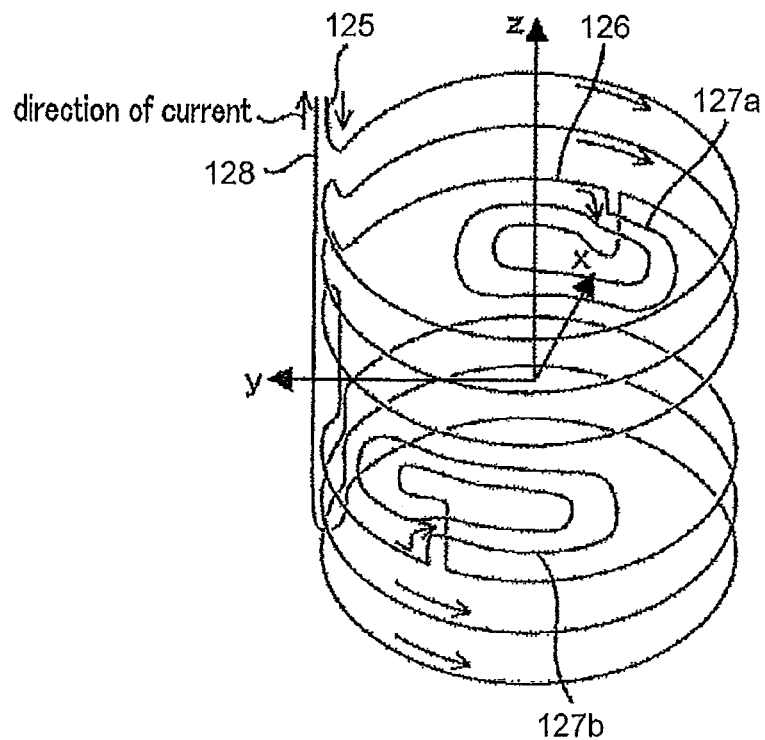

The z main coil of the gradient magnetic field coil in the present embodiment will be described below with reference to FIGS. 16A, 16B, 21A, 21B, 22A and 22B. FIG. 16A shows a development view of the wiring patterns of the z main coil of the gradient magnetic field coil in the present embodiment, and FIG. 16B shows a development view of the wiring patterns of the z shield coil. In the present embodiment, the wiring patterns are those of the z-gradient magnetic field coil with the cross-sectional shape (the cross-sectional shape with respect to x-y plane) shown in FIG. 17. The wiring patterns 117 of the z main coil have current flow paths, each of which is on a plane perpendicular to the z axis and in a shape of ellipse that is longitudinal in the x direction, and form a solenoid form coil with lamination of the current flow paths in the z direction, as shown in FIG. 16A. On the other hand, wiring patterns 118 of the z shield coil form, as shown in FIG. 16B, a coil substantially in a solenoid form that is serpentine around z-axis on a cylindrical surface, and wiring patterns 119 form loops across the z=0 plane. In such a manner, the z shield coil is formed in a saddle form (A loop is formed.) near the center of a magnetic resonance imaging device, while, in regions outside the region where the z shield coil is formed in a saddle form, the z shield coil has wiring patterns formed substantially in a solenoid form that is serpentine around the z-axis on a cylindrical surface. In other words, as shown in FIG. 22A, the z shield coil includes a wiring section formed substantially in a solenoid form that is serpentine around the z-axis on a cylindrical surface, a wiring section formed in a saddle form, and a wiring section formed substantially in a solenoid form that is serpentine around the z-axis on the cylindrical surface, in this order along the moving direction of a bed device 41. Connection sections for connecting current flow paths neighboring each other are not shown in FIG. 16A nor 16B in the present embodiment.

According to the present embodiment, wiring of conductors can be simplified by that the z main coil has current flow paths that are elliptical and longitudinal along x direction on a plane perpendicular to the z axis and the current flow paths are laminated along z direction in a solenoid form. Further, in the solenoid form coil, z position of a conductor is constant in the circumferential direction excluding the connection section for connection with neighboring patterns, and easy manufacturing is thereby attained. Further, as distortion of the magnetic field distribution generated by the z main coil in the image capturing region is small, it is possible to obtain information on cross sections with high accuracy in image capturing.

Figure 20A:
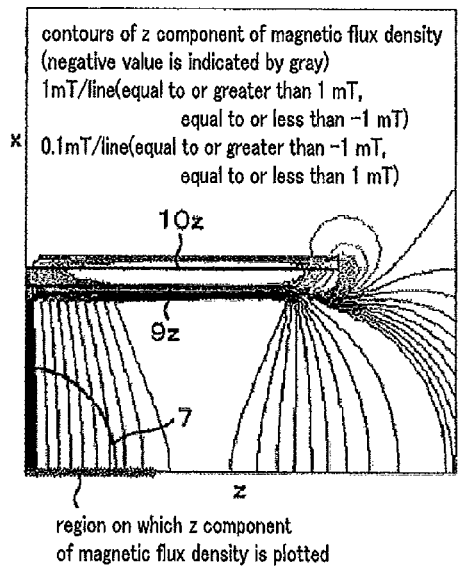
Figure 20B:
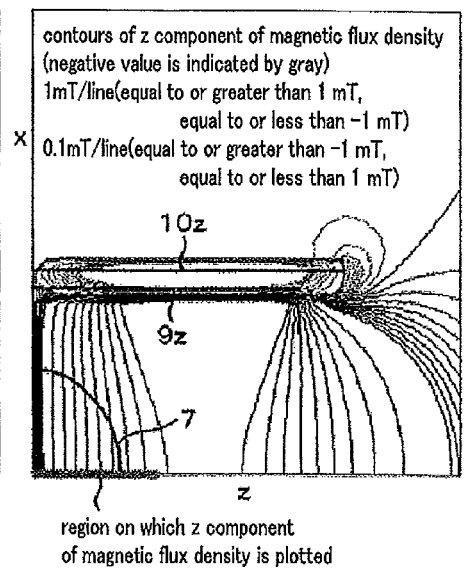
Figure 20C:
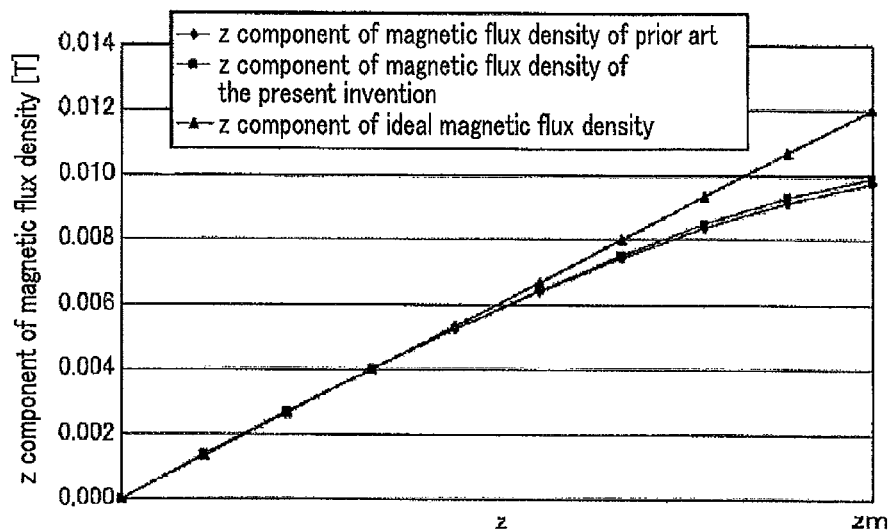
FIG. 20C is a plot view of z component of the magnetic flux density on a line extending in the axis direction from the central part of the image capturing region.

The effects of this advantage will be confirmed below by comparison in the magnetic flux density generated by z-gradient magnetic field coils. FIG. 20A shows the contours of the z component of the magnetic flux density generated by the z-gradient magnetic field coil in comparison 2 with respect to the x-z plane. The width of the contours is 1 (mT) for values of the magnetic flux density equal to or greater than 1 (mT) and equal to or less than −1 (mT), and 0.1 (mT) for other values. FIG. 20B shows the contours of the z component of the magnetic flux density in the present embodiment. As these contours in these two figures show almost the same distribution, FIG. 20C shows plots of the z component of the magnetic flux density on a line extending in the axis direction from the central portion of the image capturing region. In FIG. 20C, the distribution plotted by rhombuses is distribution in Comparative Example 2, the distribution plotted by squares is distribution in the present embodiment, and the distribution plotted by triangles is an ideal distribution. The value of deviation, at the position zm along the axis direction, from the ideal distribution is smaller in the present embodiment than in Comparison Example 2, and it is thereby recognized that the z-gradient magnetic field coil in the present embodiment forms a magnetic field distribution with an excellent accuracy.

The structure of the foregoing z-gradient magnetic field coils in the present embodiment will be described below. FIG. 21A shows the wiring patterns of the z main coil of the z-gradient magnetic field coil in the present embodiment, including the connection sections for elliptical electric current flow paths laminated along z direction. Current flows in a connection wire 120 arranged parallel to z-axis and on the y direction side, flows in the wires of elliptical flow paths in the area z<0 and the in the wires 121 of elliptical flow paths in the area z>0, and reaches a connection wire 122. Herein, the connection sections may be arranged either on the x direction side or on the y direction side. However, as the space margin for arrangement is larger on the y direction side where the gap between the z main coil and the z shield coil is wider than on the x direction, the connection sections are most appropriately arranged at the portion on the y direction side. FIG. 21B shows a portion of a conductor of the z main coil in the present embodiment. Most appropriately, a conductor 123 has a structure for letting refrigerant 124 flow inside. The reason for this will be described below. During image capturing, the amplitude of a current flowing in a conductor of a gradient magnetic field coil is several hundred (A) and a voltage for driving it is approximately 1000 (V), wherein the amount of heat generation inside the conductor cannot be neglected due to such a high voltage, and it is necessary to provide a mechanism for cooling the conductor. On the other hand, the arrangement space for the gradient magnetic field coil arranged between the hollow cylindrical housing for housing superconductive coils and the image capturing region is limited. Accordingly, it is desirable to employ the structure according to the present embodiment which does not additionally require arrangement of cooling pipes. Hereinafter, it will be assumed that a z-gradient magnetic field coil is constructed with such a conductor.

As shown in FIG. 21A, the z main coil can be formed without any intersection between wires with an exception of the connection wire 120. As the connection wire 120 is arranged on the y direction side where a space margin for arrangement is ensured, no problem with the space for arrangement is caused. On the other hand, as the z shield coil includes both wires substantially in a solenoid form and loop wires, wires intersect with each other. Consequently, some portions cannot be included in the space for arrangement. A solution for this problem will be described below.

Figure 22B:
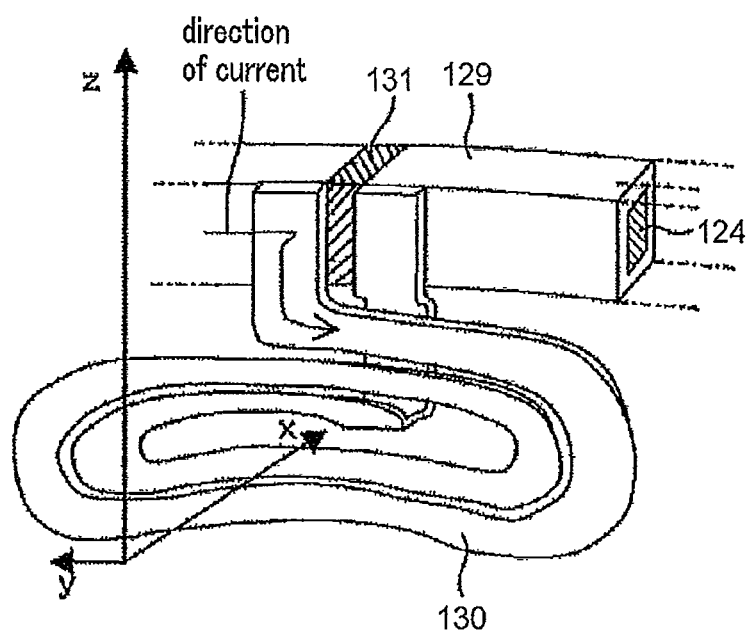

FIG. 22A shows the wiring patterns of the z shield coil of the z-gradient magnetic field coil in the present embodiment, including connection sections. Current flows in a connection wire 125 arranged parallel to z-axis on the y direction side, flows in wires 126 substantially in a solenoid form in the area z>0, flows in a loop wire 127a, flows in wires substantially in a solenoid form in the area z<0, flows in a loop wire 127b, and reaches a connection wire 128. Herein, similarly to the z main coil, the connection sections may be arranged either on the x direction side or on the y direction side. However, as the space margin for arrangement is larger on the y direction side where the gap between the z main coil and the z shield coil is wider than on the x direction, the connection sections are most appropriately arranged on the y direction side. Further, although, in the present embodiment, the loop wire 127a is connected with a wire substantially in a solenoid form in the area z>0 and the loop wire 127b is connected with a wire substantially in a solenoid form in the area z<0, the loop wire 127a may be connected with a wire substantially in a solenoid form in the area z<0, and the loop wire 127b may be connected with a wire substantially in a solenoid form in the area z>0. FIG. 22B shows a portion of the conductor shape of the z shield coil in the present embodiment. As shown in FIG. 22A, the z shield coil is formed by a combination of solenoid formed coils and loop coils. The portions substantially in a solenoid form can have a structure in which refrigerant 124 flows inside a conductor, as shown with the conductor 129. However, when it is attempted to use the structure of the conductor 129 for the loop conductor 130, the wire intersects at a portion where the conductor extends toward outside after extending, in a scrolled form, from outside and reaching the center. Consequently, the wire cannot be set within the arrangement space. In this situation, a loop coil is formed by a conductor in a thin plate shape for which the groove, which is a region where current does not flow, is cut off. This is electrically joined with a coil in a solenoid form to form the z shield coil. Herein, an insulation layer 131 is provided in a vicinity of the conductor 130 so that a current flows from the conductor 129 to the conductor 130. In such a manner, the portions substantially in a solenoid form of the z shield coil are arranged to have a cooling function by flowing refrigerant inside the portions, and a thin conductor is used for the loop portions of the z shield coil. Thus, the arrangement space for the gradient magnetic field coil can have a margin.

According to the present embodiment, wiring of conductors can be simplified by making the main coil, which is a z-gradient magnetic field coil, be in a solenoid form with lamination of current flow paths, in the z direction, each of which is formed on a plane perpendicular to the z-axis. Further, in the solenoid form coil, z position of a conductor is constant along the circumferential direction excluding the connection section for connection with neighboring patterns, and easy manufacturing is thereby attained. Further, as distortion of the magnetic field distribution generated by the main coil in the image capturing region is small, it is possible to obtain information on cross sections with high accuracy in image capturing.

According to the present embodiment, by arranging the gradient magnetic field shield coils 10x, 10y, 10z, similarly to first embodiment, it is possible to reduce leakage of a pulse form magnetic field generated by the gradient magnetic field main coils 9x, 9y, 9z to outside, and to reduce generation of eddy currents in the housings (the helium container, the radiation shield, the vacuum housing) that cover the static-magnetic-field coil 1, and attain a desired gradient magnetic field distribution. Further, by arranging the gradient magnetic field shield coils between the gradient magnetic field main coils and the static-magnetic-field coil device 1, it is possible to reduce vibration of the static-magnetic-field coil 1 caused by a current flowing in the static-magnetic-field coil 1 and a vibration electromagnetic force generated in a magnetic field leaking from the gradient magnetic field main coils, and prevent temporal variation in a uniform magnetic field that is generated in the image capturing region.

Seventh Embodiment

A horizontal magnetic field MRI device in another embodiment of the present invention will be described below, with reference to FIG. 23.

Figure 23A:
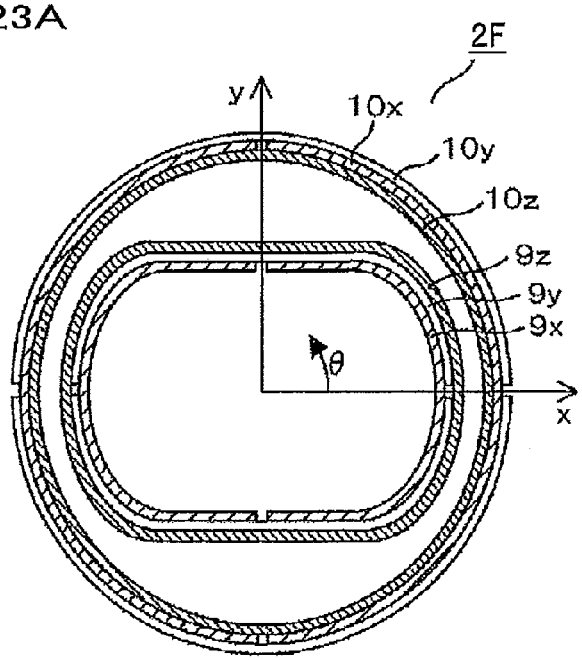
Figure 23B:
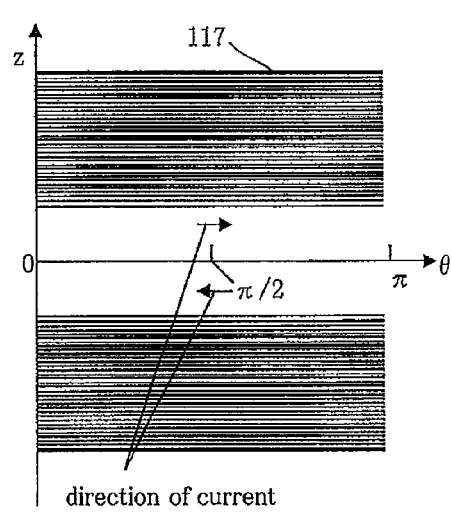
Figure 23C:
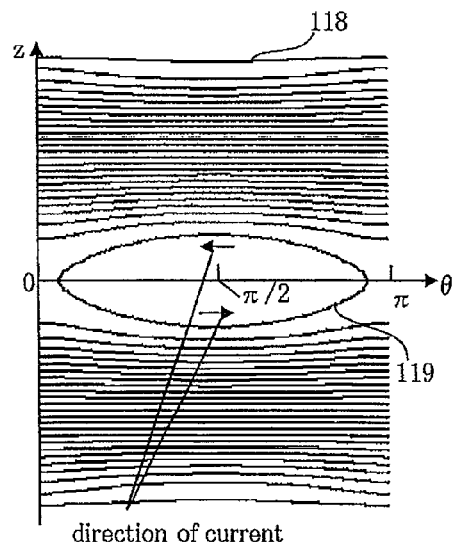

The MRI device in the present embodiment has a structure where the gradient magnetic field coil 2E of the MRI device in the sixth embodiment is replaced by a gradient magnetic field coil 2F. The sixth embodiment has been described on a case where, for the gradient magnetic field coil 2E, the cross-sectional shapes of the gradient magnetic field main coils 9 are elliptical while the cross-sectional shapes of the gradient magnetic field shield coils 10 are circular. For the gradient magnetic field coil 2F in the present embodiment, as shown in FIG. 23A, the cross-sections of the gradient magnetic field main coils 9 are in a racetrack shape while the cross-section of the gradient magnetic field shield coils 10 are in a circular shape. As these gradient magnetic field main coils 9 have a racetrack shape with a long axis in the x-axis direction and a short axis in the y-axis direction, the sense of openness with the MRI device 100 is further improved. Also in the case of the gradient magnetic field coil 2F in the present embodiment, the gap between the gradient magnetic field main coils 9 and the gradient magnetic field shield coils 10 changes with the circumferential direction, wherein the gap between the gradient magnetic field main coils 9 and the gradient magnetic field shield coils 10 is narrower on the x-axis than on the y-axis. Similarly to the sixth embodiment, the gap between the z main coil and the z shield coil changes with the circumferential direction.

FIG. 23A shows the cross-sectional shape of the gradient magnetic field coil 2F in the present embodiment. Regarding the z-gradient magnetic field coil obtained by this cross-sectional shape, the z main coil has the wiring patterns shown in FIG. 23B and the z shield coil has the wiring patterns show in FIG. 23C. Similarly to the sixth embodiment, in the present embodiment, wiring patterns 117 of the z main coil can be formed in a solenoid form with lamination, in the z direction, of current flow paths each of which is on a plane perpendicular to the z direction. Similarly to the sixth embodiment, the z shield coil is constructed with wiring patterns 118 substantially in a solenoid form and wiring patterns 119 forming a loop.

According to the present embodiment, wiring of conductors can be simplified by making the main coil of a z-gradient magnetic field coil be in a solenoid form with lamination of current flow paths, in the z direction, each of which is formed on a plane perpendicular to the z-axis. Further, in the solenoid form coil, z position of a conductor is constant along the circumferential direction excluding the connection section for connection with neighboring patterns, and easy manufacturing is thereby attained. Further, as distortion of the magnetic field distribution generated by the main coil in the image capturing region is small, it is possible to obtain information on cross sections with high accuracy in image capturing.

According to the present embodiment, effects similar to those in sixth embodiment can be obtained.

Eighth Embodiment

A horizontal magnetic field MRI device in another embodiment of the present invention will be described below, with reference to FIG. 24.

Figure 24A:
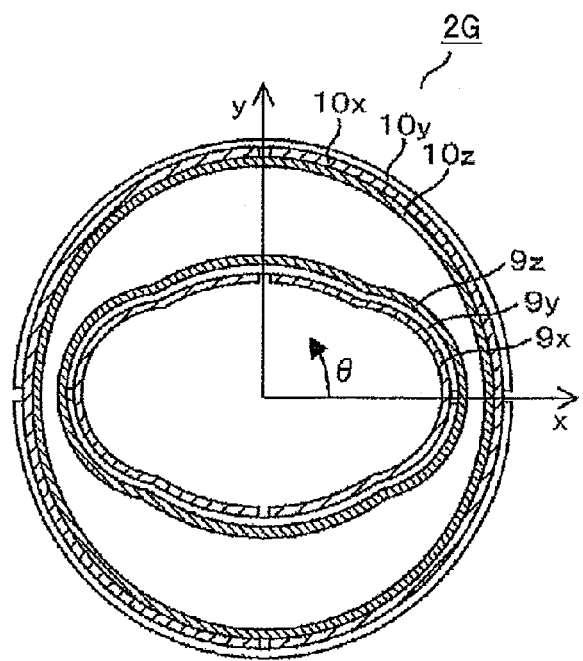
Figure 24B:
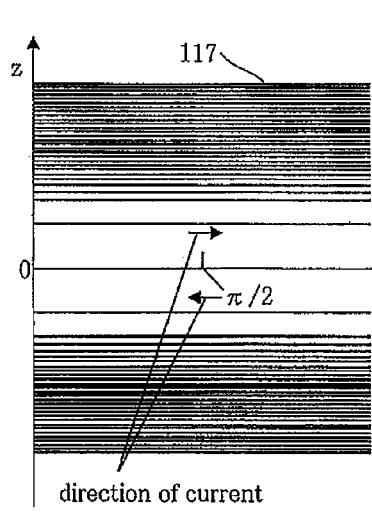
Figure 24C:
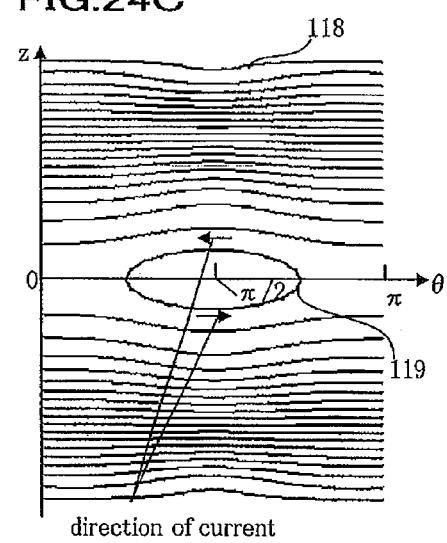

The MRI device in the present embodiment has a structure where the gradient magnetic field coil 2E of the MRI device in the sixth embodiment is replaced by a gradient magnetic field coil 2G. As shown in FIG. 24A, regarding the gradient magnetic field coil 2G in the present embodiment, gradient magnetic field main coils 9 (9x, 9y, 9z) have a shape of combination of arcs, and gradient magnetic field shield coils 10 (10x, 10y, 10z) have a circular shape. The cross-sectional shape of the gradient magnetic field main coils 9 has the shape of a combination of an ellipse and arcs at the long axis portions of this ellipse (a shape of combination of plural arcs with different curvatures). In such a manner, also in the case of the gradient magnetic field coil 2G in the present embodiment, the gap between the gradient magnetic field main coils 9 and the gradient magnetic field shield coils 10 changes with the circumferential direction, wherein the gap between the gradient magnetic field main coils 9 and the gradient magnetic field shield coils 10 is narrower on the x-axis than on the y-axis. Likewise, the gap between the z main coil and the z shield coil changes with the circumferential direction.

FIG. 24A shows the cross-sectional shape of the gradient magnetic field coil 2G in the present embodiment. Regarding the z-gradient magnetic field coil obtained by this cross-sectional shape, the z main coil has the wiring patterns show in FIG. 24B and the z shield coil has the wiring patterns show in FIG. 24C. Similarly to the sixth embodiment, in the present embodiment, wiring patterns 117 of the z main coil can be formed in a solenoid form with lamination, in the z direction, of current flow paths each of which is on a plane perpendicular to the z direction. Similarly to the sixth embodiment, the z shield coil is constructed with wiring patterns 118 substantially in a solenoid form and wiring patterns 119 forming a loop.

According to the present embodiment, wiring of conductors can be simplified by making the main coil, which is a z-gradient magnetic field coil, be in a solenoid form with lamination of current flow paths, in the z direction, each of which is generated on a plane perpendicular to z-axis. Further, in the solenoid form coil, z position of a conductor is constant along the circumferential direction excluding the connection section for connection with neighboring patterns, and easy manufacturing is thereby attained. Further, as distortion of the magnetic field distribution generated by the main coil in the image capturing region is small, it is possible to obtain information on cross sections with high accuracy in image capturing.

According to the present embodiment, effects similar to those in sixth embodiment can be obtained.

Ninth Embodiment

A horizontal magnetic field MRI device in another embodiment of the present invention will be described below, with reference to FIG. 25.

The MRI device in the present embodiment has a structure where the gradient magnetic field coil 2E of the MRI device in the sixth embodiment is replaced by a gradient magnetic field coil 2H. For the gradient magnetic field coil 2H in the present embodiment, as shown in FIG. 25, the cross-sections of the gradient magnetic field main coils 9 (9x, 9y, 9z) and the gradient magnetic field shield coils 10 (10x, 10y, 10z) are both in circular shapes, however, these circular shapes are not concentric and have respective centers that are deviated from each other with respect to the y-axis direction (The central position of the circular shapes are different). Also in the case of the gradient magnetic field coil 2H in the present embodiment, the gap between the gradient magnetic field main coils 9 and the gradient magnetic field shield coils 10 changes with the circumferential direction. Likewise, although the cross-sectional shapes of the z main coil and the z shield coil in the present embodiment are both circles, the circles are not concentric circles. The gap between the z main coil and the z shield coil has accordingly a shape that changes with the circumferential direction.

Figure 25A:
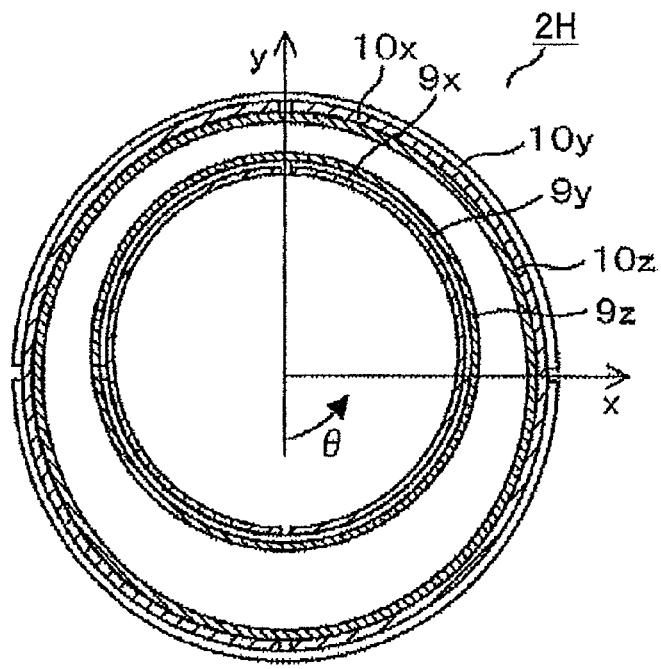
Figure 25B:
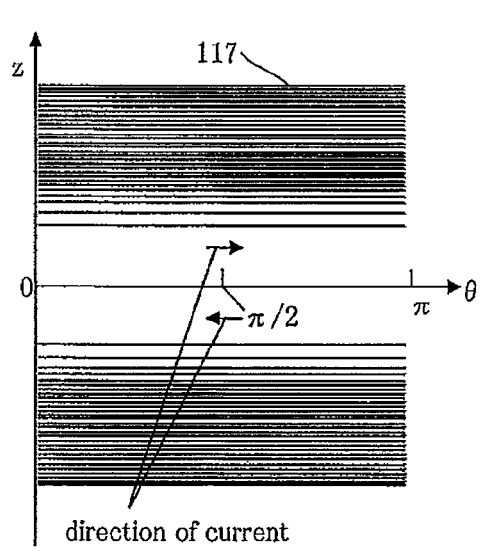
Figure 25C:
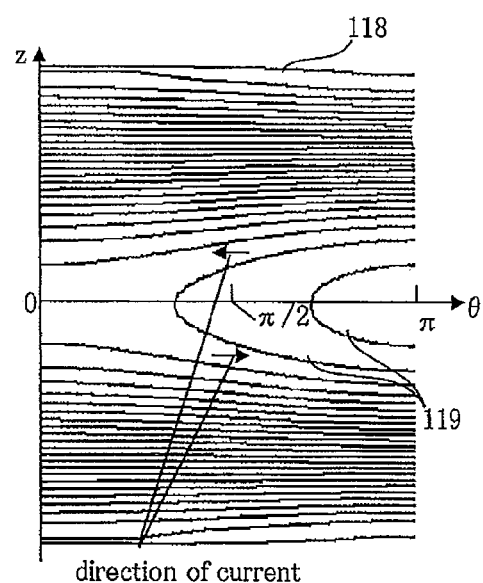

FIG. 25A shows the cross-sectional shape of the gradient magnetic field coil 2H in the present embodiment. Regarding the z-gradient magnetic field coil obtained by this cross-sectional shape, the z main coil has the wiring patterns show in FIG. 25B and the z shield coil has the wiring patterns show in FIG. 25C. Similarly to the sixth embodiment, in the present embodiment, wiring patterns 117 of the z main coil can be formed in a solenoid form with lamination, in the z direction, of current flow paths each of which is on a plane perpendicular to the z direction. The z shield coil is constructed with wiring patterns 118 substantially in a solenoid form and wiring patterns 119 forming a loop.

In each of the sixth, seventh, and eighth embodiments, as the cross-sectional shape of the z main coil is symmetric with respect to y-z plane and x-z plane, a region where the z main coil is the closest to the z shield coil is present at two positions, which are in the +x direction and the −x direction, and one or plural wiring patterns 119 are formed in the respective regions. In contrast, in the present embodiment, a region with the closest gap between the z main coil and the z shield coil is present at one position, which is in the +y direction, and wiring patterns 119 are formed only in this region.

According to the present embodiment, wiring of conductors can be simplified by making the main coil, which is the z-gradient magnetic field coil, be in a solenoid form with lamination of current flow paths, in the z direction, each of which is generated on a plane perpendicular to the z-axis. Further, in the solenoid form coil, z position of a conductor is constant along the circumferential direction excluding the connection section for connection with neighboring patterns, and easy manufacturing is thereby attained. Further, as distortion of the magnetic field distribution generated by the main coil in the image capturing region is small, it is possible to obtain information on cross sections with high accuracy in image capturing.

According to the present embodiment, effects similar to those in sixth embodiment can be obtained.

Tenth Embodiment

A horizontal magnetic field MRI device in another embodiment of the present invention will be described below, with reference to FIG. 26.

Figure 26A:
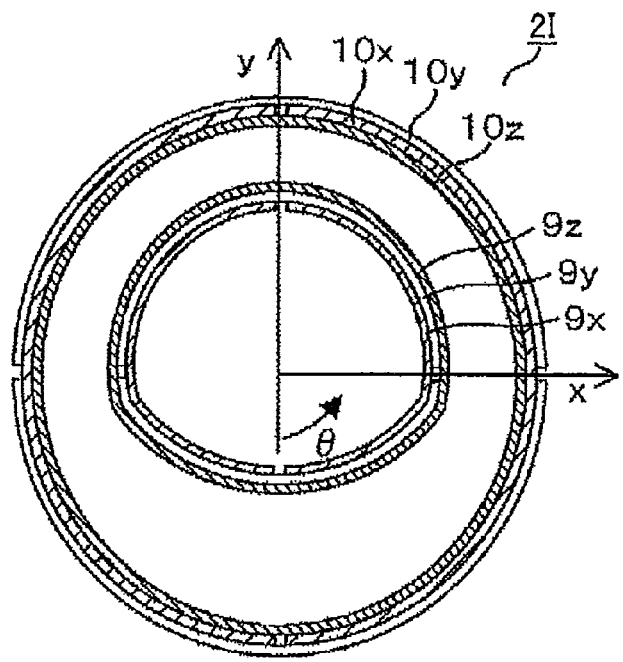
Figure 26B:
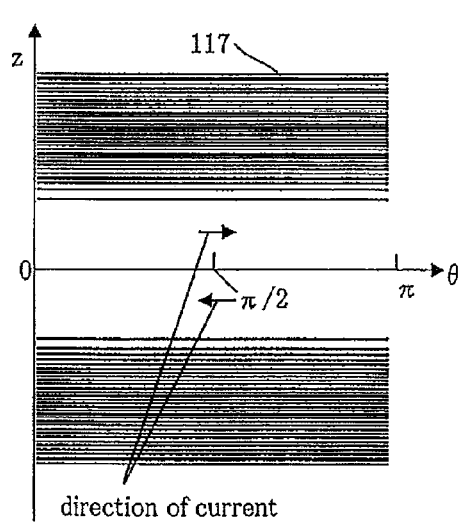
Figure 26C:
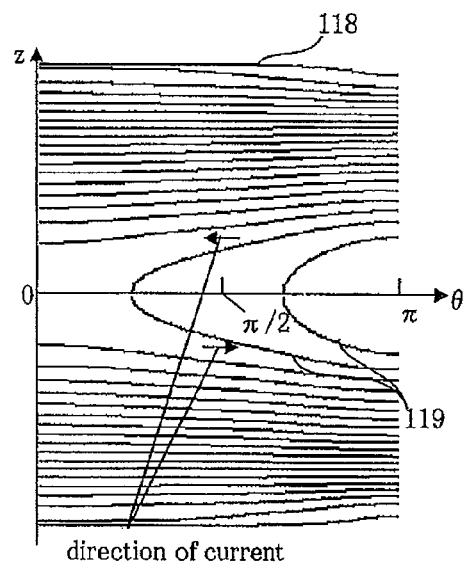

The MRI device in the present embodiment has a structure where the gradient magnetic field coil 2E of the MRI device in the sixth embodiment is replaced by a gradient magnetic field coil 2I. As shown in FIG. 26A, regarding the gradient magnetic field coil 2I in the present embodiment, gradient magnetic field main coils 9 (9x, 9y, 9z) have a cross-sectional shape of combination of elliptical arcs, and gradient magnetic field shield coils 10 (10x, 10y, 10z) have a cross-sectional shape of a circular shape. The cross-sectional shape of the gradient magnetic field main coils 9 has a shape whose upper ellipse and lower ellipse are different. As in the present embodiment, by making the upper elliptical shape be larger than the lower elliptical shape (making the opening area larger in the positive region than in the negative region with respect to y-axis, for the cross-sectional shape shown in FIG. 26A), it is possible to make a region where a subject 40 can pass through to be wide.

FIG. 26A shows the cross-sectional shape of the gradient magnetic field coil 2I in the present embodiment. Regarding the z-gradient magnetic field coil obtained by this cross-sectional shape, the z main coil has the wiring patterns show in FIG. 26B and the z shield coil has the wiring patterns show in FIG. 26C. Similarly to the sixth embodiment, in the present embodiment, wiring patterns 117 of the z main coil can be formed in a solenoid form with lamination, in the z direction, of current flow paths each of which is on a plane perpendicular to the z direction. Similarly to the ninth embodiment, the z shield coil is constructed with wiring patterns 118 substantially in a solenoid form and a wiring pattern 119 forming a loop. Wiring patterns 119 are formed only at one position that is on the +y direction.

According to the present embodiment, wiring of conductors can be simplified by making the main coil, which is the z-gradient magnetic field coil, to be in a solenoid form with lamination of current flow paths, in the z direction, each of which is generated on a plane perpendicular to the z-axis. Further, in the solenoid form coil, z position of a conductor is constant along the circumferential direction excluding the connection section for connection with neighboring patterns, and easy manufacturing is thereby attained. Further, as distortion of the magnetic field distribution generated by the main coil in the image capturing region is small, it is possible to obtain information on cross sections with high accuracy in image capturing.

According to the present embodiment, effects similar to those in sixth embodiment can be obtained.

REFERENCE SYMBOLS

1 . . . static magnetic field coil device
2 . . . gradient magnetic field coil
2a . . . gradient magnetic field main coil
2b . . . gradient magnetic field shield coil
3 . . . RF coil
4 . . . helium container
5 . . . radiation shield
6 . . . vacuum housing
7 . . . image capturing region
8 . . . static magnetic field
9x . . . x main coil
9y . . . y main coil
9z . . . z main coil (first coil)
10x . . . x shield coil
10y . . . y shield coil
10z . . . z shield coil (second coil)
17-19, 117-119 . . . wiring pattern
20-27, 120, 122, 125, 128 . . . connection wire
28 . . . crossover line
40 . . . patient (subject)
41 . . . bed (device)
100 . . . magnetic resonance imaging (MRI) device
120 . . . connection wire
121 . . . wire of elliptical flow path
122 . . . connection wire
123 . . . conductor
124 . . . refrigerant
125 . . . connection wire
126 . . . wire substantially in a solenoid form
127a, 127b . . . loop wire
128 . . . connection wire
129 . . . conductor
130 . . . loop conductor
131 . . . insulation layer
A1 . . . wide region (first region)
A2 . . . narrow region (second region)
F0 . . . zero plane

The invention claimed is:

1. A gradient magnetic field coil, comprising:
a first coil substantially in a solenoid form for generating a magnetic field distribution that is linear in an axis direction in an image capturing region of a magnetic resonance imaging device; and
a second coil that is substantially in a solenoid form and is arranged outside the first coil and inside a static magnetic field coil device for generating a static magnetic field with a uniform magnetic field distribution in the image capturing region, the second coil reducing a residual magnetic field from the first coil to the static magnetic field coil,
wherein a gap between the first coil and the second coil changes in a circumferential direction, the gap including a first region and a second region in which the gap between the first coil and the second coil is narrower than in the first region,
and wherein the first coil is arranged such that a wiring pattern that is on a side of zero plane, the zero plane including a center of the first coil and being perpendicular to the axis direction, is serpentine in the circumferential direction such as to be distant from the zero plane in the first region and close to the zero plane in the second region.

2. The gradient magnetic field coil according to claim 1, wherein distribution, in the circumferential direction, of a magnetic field generated by the first coil in a region where the second coil is disposed is substantially uniform.

3. The gradient magnetic field coil according to claim 1, wherein the second coil is arranged such that wiring patterns on an outer side and the zero plane side on the axis direction are smoothly serpentine.

4. The gradient magnetic field coil according to claim 1, wherein the first coil and the second coil are arranged such that wiring patterns neighboring each other in the first region are connected by a crossover line.

5. The gradient magnetic field coil according to claim 1, wherein a cross-sectional shape of the first coil obtained by cutting the first coil with a plane perpendicular to an axis direction of the first coil is an elliptical shape,
wherein a cross-sectional shape of the second coil obtained by cutting the second coil with a plane perpendicular to an axis direction of the second coil is a circular shape,
wherein central axes of the first coil and the second coil are aligned with each other,
wherein the first region is formed, extending from a short axis of the elliptical shape of the first coil,
and wherein the second region is formed, extending from a long axis of the elliptical shape of the first coil.

6. The gradient magnetic field coil according to claim 1, wherein a cross-sectional shape of the first coil obtained by cutting the first coil with a plane perpendicular to an axis direction of the first coil is a racetrack shape,
wherein a cross-sectional shape of the second coil obtained by cutting the second coil with a plane perpendicular to an axis direction of the second coil is a circular shape,
wherein central axes of the first coil and the second coil are aligned with each other,
wherein the first region is formed, extending from a short axis of the racetrack shape of the first coil, and wherein the second region is formed, extending from a long axis of the racetrack shape of the first coil.

7. The gradient magnetic field coil according to claim 1,
wherein a cross-sectional shape of the first coil obtained by cutting the first coil with a plane perpendicular to an axis direction of the first coil is arranged, based on an elliptical shape, such that arc portions in peripheries of both ends of a long axis of the elliptical shape are arcs expanding along a short axis direction of the elliptical shape,
wherein a cross-sectional shape of the second coil obtained by cutting the second coil with a plane perpendicular to an axis direction of the second coil is a circular shape,
wherein central axes of the first coil and the second coil are aligned with each other,
wherein the first region is formed, extending from a short axis of the elliptical shape of the first coil,
and wherein the second region is formed, extending from a long axis of the elliptical shape of the first coil.

8. The gradient magnetic field coil according to claim 1,
wherein a cross-sectional shape of the first coil obtained by cutting the first coil with a plane perpendicular to an axis direction of the first coil is a circular shape,
wherein a cross-sectional shape of the second coil obtained by cutting the second coil with a plane perpendicular to an axis direction of the second coil is a circular shape,
wherein central axes of the first coil and the second coil are deviated from each other,
and wherein, the first region and the second region are formed on opposite sides with respect to the deviation between the central axis of the first coil and the central axis of the second coil, the opposite sides being on a direction of the deviation.

9. The gradient magnetic field coil according to claim 1,
wherein a cross-sectional shape of the first coil obtained by cutting the first coil with a plane perpendicular to an axis direction of the first coil is arranged, based on a circular shape, such that an arc portion that is substantially a lower half of the circular shape has a radius larger than a radius of the circular shape,
wherein a cross-sectional shape of the second coil obtained by cutting the second coil with a plane perpendicular to an axis direction of the second coil is a circular shape,
wherein a center of the circular shape that is the base of the cross-sectional shape of the first coil and a center of the circular shape of the cross-sectional shape of the second coil are aligned with each other,
wherein the second region is formed on a side of the circular shape of the first coil,
and wherein the first region is formed on a side of the arc of the first coil, the arc having the radius larger than the radius of the circular shape of the first coil.

* * * * *